United States Patent
Arita et al.

(10) Patent No.: US 8,355,274 B2
(45) Date of Patent: Jan. 15, 2013

(54) CURRENT STEERING ELEMENT, STORAGE ELEMENT, STORAGE DEVICE, AND METHOD FOR MANUFACTURING CURRENT STEERING ELEMENT

(75) Inventors: Koji Arita, Osaka (JP); Takumi Mikawa, Shiga (JP); Mitsuteru IIjima, Osaka (JP); Kenji Tominaga, Kyoto (JP)

(73) Assignee: Panasonic Corporation, Osaka (JP)

( * ) Notice: Subject to any disclaimer, the term of this patent is extended or adjusted under 35 U.S.C. 154(b) by 165 days.

(21) Appl. No.: 13/061,312

(22) PCT Filed: Sep. 17, 2009

(86) PCT No.: PCT/JP2009/004689
§ 371 (c)(1),
(2), (4) Date: Feb. 28, 2011

(87) PCT Pub. No.: WO2010/032470
PCT Pub. Date: Mar. 25, 2010

(65) Prior Publication Data
US 2011/0164447 A1 Jul. 7, 2011

(30) Foreign Application Priority Data
Sep. 19, 2008 (JP) .................................. 2008-240472

(51) Int. Cl.
*G11C 11/00* (2006.01)
(52) U.S. Cl. .............. 365/148; 365/46; 365/55; 365/74; 365/97; 365/100; 365/131; 365/158; 365/171; 365/173; 365/163
(58) Field of Classification Search .................... 365/46, 365/55, 74, 97, 100, 131, 148, 158, 171, 365/173, 163
See application file for complete search history.

(56) References Cited

U.S. PATENT DOCUMENTS
8,213,223 B2 * 7/2012 Koh et al. ...................... 365/163
(Continued)

FOREIGN PATENT DOCUMENTS
EP 0 182 484 5/1986
(Continued)

OTHER PUBLICATIONS
Partial English translation of JP 61-174589.
(Continued)

*Primary Examiner* — Fernando Hidalgo
(74) *Attorney, Agent, or Firm* — Wenderoth, Lind & Ponack, LLP

(57) ABSTRACT

A current steering element which can prevent occurrence of write disturb even when electric pulses having different polarities are applied and can cause large current to flow through a variable resistance element, and with which data can be written without problem. In a storage element (3) including: a variable resistance element (1) whose electric resistance value changes in response to application of electric pulses having a positive polarity and a negative polarity and which maintains the changed electric resistance value; and the current steering element (2) that steers current flowing through the variable resistance element (1) when the electric pulses are applied, the current steering element (2) includes: a first electrode (32); a second electrode (31); and a current steering layer (33) interposed between the first electrode (32) and the second electrode (31). When the current steering layer (33) includes $SiN_x$ ($0 < x \leq 0.85$) and a thickness of d [nm], a relationship between a nitrogen composition ratio x and the thickness d is in a range represented by a predetermined conditional expression.

9 Claims, 26 Drawing Sheets

U.S. PATENT DOCUMENTS

| | | |
|---|---|---|
| 2004/0202041 A1 | 10/2004 | Hidenori |
| 2007/0015328 A1 | 1/2007 | Hsu et al. |
| 2007/0015329 A1 | 1/2007 | Li et al. |
| 2007/0015330 A1 | 1/2007 | Li et al. |
| 2007/0015348 A1 | 1/2007 | Hsu et al. |
| 2007/0284575 A1 | 12/2007 | Li et al. |
| 2008/0006814 A1 | 1/2008 | Hsu et al. |
| 2009/0032817 A1 | 2/2009 | Li et al. |
| 2009/0052225 A1 | 2/2009 | Morimoto |
| 2009/0052226 A1* | 2/2009 | Lee et al. .................. 365/148 |
| 2009/0224224 A1 | 9/2009 | Fuji et al. |
| 2010/0032641 A1 | 2/2010 | Mikawa et al. |
| 2010/0061142 A1 | 3/2010 | Arita et al. |
| 2010/0172171 A1 | 7/2010 | Azuma et al. |

FOREIGN PATENT DOCUMENTS

| | | |
|---|---|---|
| JP | 61-94086 | 5/1986 |
| JP | 61-174509 | 8/1986 |
| JP | 61-174589 | 8/1986 |
| JP | 4-253024 | 9/1992 |
| JP | 6-18937 | 1/1994 |
| JP | 2004-319587 | 11/2004 |
| JP | 2006-203098 | 8/2006 |
| JP | 2006-319083 | 11/2006 |
| JP | 2007-27755 | 2/2007 |
| WO | 2008/059701 | 5/2008 |
| WO | 2008/062688 | 5/2008 |
| WO | 2008/117494 | 10/2008 |
| WO | 2008/149493 | 12/2008 |

OTHER PUBLICATIONS

International Search Report issued Nov. 2, 2009 in International (PCT) Application No. PCT/JP2009/004689.

M. Iwamoto, et al., "*EE Text denki denshi zairyo kogaku*", ohm-sha, Sep. 25, 2004, p. 140 line 5 to p. 141 line 19 with partial translation.

R. Karcher et al. "*Electronic structure of hydrogenated and unhydrogenated amorphous SiNx: A photoemission study*", Physical Review B, vol. 30, pp. 1896-1910, Aug. 15, 1984.

* cited by examiner

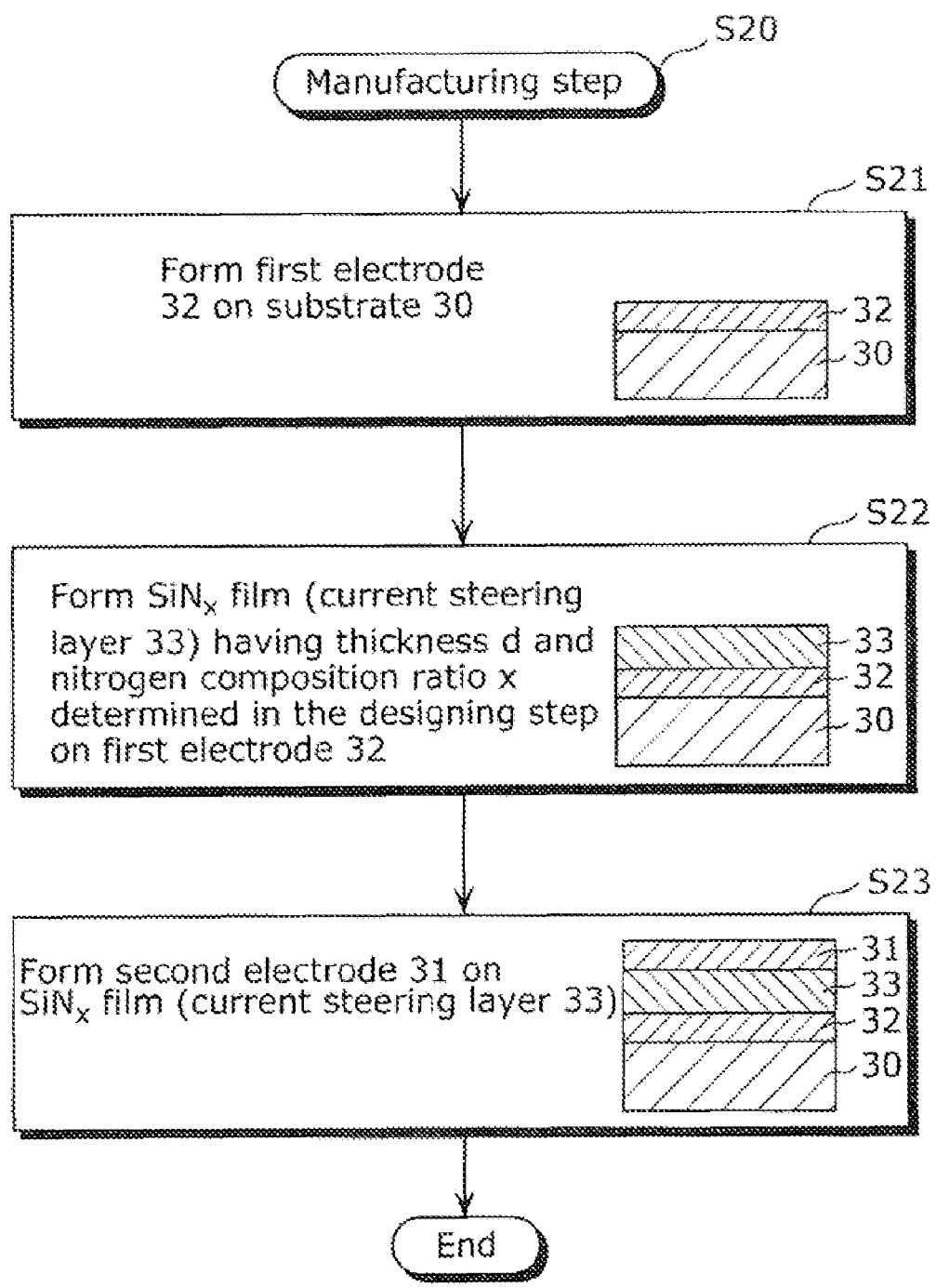

CURRENT STEERING ELEMENT, STORAGE ELEMENT, STORAGE DEVICE, AND METHOD FOR MANUFACTURING CURRENT STEERING ELEMENT

TECHNICAL FIELD

The present invention relates to current steering elements used for non-volatile storage elements suitable for increasing the degree of integration and an operation speed, storage elements using the current steering elements, storage devices provided with the storage elements in a matrix, and methods of manufacturing the current steering elements. In particular, the present invention relates to a current steering element used for the non-volatile storage element, in which data is written by applying electric pulses having different polarities, a storage element using the current steering element, a storage device provided with the storage elements in a matrix, and a method of manufacturing the current steering element.

BACKGROUND ART

With the development in the digital technology in recent years, electronic devices such as mobile information-processing equipment and home information appliances have increasingly been sophisticated. With the sophistication of these electronic devices, there has been a rapid progress in the size, integration, and operation speed of the nonvolatile storage devices used for these electronic devices. In addition, the application of the nonvolatile storage devices has rapidly been expanded.

Among them, a storage device has been proposed which use, as a storage element, non-volatile variable resistance elements provided in a matrix therein, and there has been expectation for further progress in the size, integration, and operation speed as three-dimensional memories.

The variable resistance element includes a thin film composed of a material mainly made up of a metal oxide. The electrical resistance value of the thin film changes upon application of electric pulses, and the changed electrical resistance value is stored. Thus, when a high resistance state and a low resistance state of the thin film correspond to binary data "1" and "2", respectively, the binary data can be stored in the variable resistance element. It is to be noted that the current density of electric pulses applied to the thin film of the variable resistance element and the magnitude of the electric field generated in response to the application of electric pulses are only necessary to be a degree sufficient to cause a physical state of the thin film to change and not to damage the thin film.

In addition, the variable resistance element that takes binary values includes (i) a variable resistance element that changes its resistance value in response to application of electric pulses having the same polarity and different voltages (so-called unipolar type) and (ii) a variable resistance element that changes its resistance value in response to application of electric pulses having different polarities (so-called bipolar type). In general, the unipolar type of variable resistance element has characteristics of which writing when changing from the low resistance state to the high resistance state (so-called reset) takes longer amount of time than writing when changing from the high resistance state to the low resistance state (so-called set). On the other hand, writing in the bipolar type of variable resistance element can be carried out in short amount of time in both of the set and reset.

In a storage device including such a variable resistance element (so-called a cross point storage device) provided at a corresponding one of three-dimensional crosspoints of word lines and bit lines which orthogonally cross without coming in contact with each other, there is, in some cases, a disorder that, when data is written into a variable resistance element, the electrical resistance value of another variable resistance element changes due to a bypass current. Hereafter, the disorder is called "write disturb". Thus, when such a cross-point storage device is configured, it is necessary to separately provide a particular configuration in order to prevent the write disturb from occurring.

Since the resistance of the unipolar type of variable resistance element can be changed by applying electric pulses having the same polarity, it is possible to prevent occurrence of the write disturb by arranging unipolar current steering elements, such as a PN junction diode or a Schottky diode, in series to the variable resistance element. The unipolar current steering elements have nonlinear voltage-current characteristics including the high resistance state and the low resistance state in a voltage range of one polarity of a voltage.

A storage device is disclosed which includes a storage element composed of a series circuit of a variable resistance element and a Schottky diode (a current steering element), as a storage device capable of preventing occurrence of such write disturb (see PTL 1, for example).

In the proposed storage device, the bypass current flowing into the variable resistance element of storage elements other than the storage element into which data is to be written (selected storage element) is blocked by the Schottky diode. This prevents occurrence of write disturb in the cross point storage device. Here, in the proposed storage device, writing of data into the variable, resistance element is carried out by applying, to the variable resistance element, electric pulses having the same polarity. Thus, writing of data is not disturbed by the Schottky diode connected in series to the variable resistance element.

On the other hand, since bipolar electric pulses are used for writing into the variable resistance element when the bipolar type of variable resistance element is used, a bipolar current steering element needs to be provided in series to the variable resistance element. The bipolar current steering element has nonlinear voltage-current characteristics including the high resistance state and the low resistance state in a voltage range of a positive polarity and a negative polarity. A two-terminal device such as metal-insulator-metal (MIM) diode, metal-semiconductor-metal (MSM) diode, and a varistor is known as an element having such characteristics.

FIG. 25A and FIG. 25B is a characteristic diagram schematically showing voltage-current characteristics of the current steering to element. FIG. 25A is a voltage-current characteristic diagram of a bipolar current steering element such as the MIM, the MSM, or the varistor, and FIG. 25B is a voltage-current characteristic diagram of a Schottky diode.

As shown in FIG. 25B, the Schottky diode shows nonlinear electric resistance characteristics, however, the voltage-current characteristics are not symmetric at all with respect to the polarity of applied voltages.

On the other hand, the two-terminal device such as the MIM diode, the MSM diode, and the varistor shows the nonlinear electric resistance characteristics and the voltage-current characteristics substantially symmetric with respect to the polarity of applied voltages. That means that each of change in a current with respect to a positive applied voltage and change in a current with respect to a negative applied voltage becomes substantially symmetric with respect to an original point. In addition, in those two-terminal devices, the electric resistance is significantly high in a range (the range C) in which an applied voltage is equal to or lower than a first critical voltage (the lower limit voltage in the range A) and equal to or higher than a second critical voltage (the upper limit voltage in the range B), whereas the electric resistance rapidly decreases when exceeding the first critical voltage or falling below the second critical voltage. More specifically, these two-terminal devices have nonlinear electric resistance characteristics with which large current flows when an applied voltage exceeds the first critical voltage or falls below the second critical voltage.

Thus, using these two-terminal devices as bipolar current steering elements makes it possible to avoid occurrence of write disturb in a cross point nonvolatile storage device that uses a bipolar variable resistance element capable of a high-speed operation in both setting and resetting.

In a storage device of a variable-resistance type, comparatively large current is usually required to flow through the variable resistance element when writing data into a variable resistance element, although it highly depends on a material, a configuration, and so on of the variable resistance element, in order to change the electric resistance value by applying electric pulses to the variable resistance element to change the state of the variable resistance element from a high resistance state to a low resistance state. It is disclosed, for example, that, in an operation of a storage device including a variable resistance element, current is caused to flow, using a varistor, with a current density equal to or higher than 30000 A/cm$^2$ when writing data into the variable resistance element (see PTL 2, for example). In recent years, various considerations have been made to reduce the current necessary for writing data into a variable resistance element. As a result, it is now considered that the current density equal to or higher than 30000 A/cm$^2$ is not necessarily required as a current density of current necessary for writing data into the variable resistance element. However, significantly large current of 10000 to several tens of thousands of A/cm$^2$ is generally required when writing data into the variable resistance element.

CITATION LIST

Patent Literature

[PTL 1]
Japanese Unexamined Patent Application Publication No. 2004-319587
[PTL 2]
Japanese Unexamined Patent Application Publication No. 2006-203098

SUMMARY OF INVENTION

Technical Problem

As shown in the patent literatures, a bipolar current steering element described above is necessary for implementing a cross point non-volatile storage device that uses a bipolar variable resistance element that can operate at high speed. It is generally necessary to cause large current to flow through the variable resistance element, although it highly depends on a material, a configuration, and so on of the variable resistance element, in order to change the electric resistance value by applying electric pulses to the variable resistance element to change the state of the variable resistance element to a high resistance state or to a low resistance state.

Based on the point of view, there is a problem that it is not possible to cause significantly large current to flow because an MIM diode includes an insulation film interposed between electrodes. In addition, there is a problem that variation occurs in characteristics of a current steering element when the varistor is applied as a multilayered memory and the like having a stacking structure because the varistor gains rectification property due to the characteristics of crystal grain boundary of the material interposed between the electrodes. On the other hand, the MSM diode includes a semiconductor interposed between metal electrodes, and can be expected to have a current supplying capability higher than that of the MIM diode. Furthermore, since characteristics such as crystal grain boundary are not used in the MSM diode, it is expected to obtain the current steering element which is hardly affected by a heat history and so on during the manufacturing process and which includes less variation. However, very few considerations have been made for MSM diodes from the standpoint of causing large current to flow, and there is no report of an MSM diode which is a two-terminal device composed of a material system that is compatible with the manufacturing process of a so-called silicon semiconductor (used in the past in a manufacturing process of a silicon semiconductor, for example) and which can supply current equal to or larger than 10000 A/cm$^2$.

To address the above-described conventional problems, the inventors found that it is possible to use, as a current steering element that causes large current to flow, the MSM diode in which SiN$_x$ is interposed between electrodes. Here, SiN$_x$ is a so-called silicon nitride and the value of x indicates the degree of nitriding (composition ratio of nitrogen with respect to silicon); however, the electrical conduction property of SiN$_x$ changes significantly according to the nitrogen composition ratio x. More specifically, the SiN$_x$ is an insulation in terms of a so-called stoicheiometric composition (x=1.33, that is, Si$_3$N$_4$); however, the SiN$_x$ gradually changes to behave as a semiconductor when the nitrogen ratio decreases from the composition (in other words, when the nitrogen composition ratio x is reduced). Therefore, it is necessary to appropriately control the nitrogen composition ratio x to utilize the function of the MSM diode.

In addition, the electrical characteristics of the MSM diode are affected by the thickness of SiN$_x$ as well. A trend is found of which larger current flows through the MSM diode as the thickness of SiN$_x$ is smaller when the nitrogen composition ratio x is the same in the case where a same voltage is applied to the both ends of the MSM diode, from a result of evaluating the MSM diode manufactured by way of trial, and thus it is necessary to appropriately set the thickness of SiN$_x$ in addition to the nitrogen composition ratio x in order to manufacture the MSM diode having desired characteristics.

The present invention has been conceived to solve the above-described problems, and it is an object thereof to provide: a current steering element and a storage element capable of preventing occurrence of write disturb even when electric pulses having different polarities are applied, causing large current to flow through the variable resistance element, and writing data without problem; a storage device including the current steering element and the storage element; and a method of manufacturing the current steering element. In particular, the present invention aims to provide: a configuration (the composition and the thickness of SiN$_x$ interposed between metal electrodes) of which the current steering element is composed of an MSM diode that includes SiN$_x$ interposed between the electrodes; a storage element in which the configuration is applied; a storage device including the storage elements provided in a matrix; and a method of manufacturing the current steering element.

Solution to Problem

In order to solve the problem described above, an aspect of the current steering element according to the present invention is a current steering element which suppresses passing current that flows when electric pulses having a positive polarity and a negative polarity are applied, the current steering element comprising: a first electrode; a second electrode; and a current steering layer interposed between the first electrode and the second electrode, wherein, when the current steering layer includes $SiN_x$ in which x denotes a nitrogen composition ratio and is within a range of $0<x\leq0.85$ and has a thickness of d nanometer, and a maximum value of a voltage that can be applied between both ends of the current steering element is $V_0$ volt, a relationship between the nitrogen composition ratio x and the thickness d is in a range that satisfies Expression (1) and Expression (2) described below.

$$(\ln(10000(C \exp(\alpha d)\exp(\beta x))^{-1})/\gamma)^2 \leq V_0 \quad \text{Expression (1)}$$

$$(\ln(1000(C \exp(\alpha d)\exp(\beta x))^{-1})/\gamma)^2 - (\ln(10000(C \exp(\alpha d)\exp(\beta x))^{-1})/\gamma)^2/2 \geq 0 \quad \text{Expression (2)},$$

where $C=7.46\times10^{-2}$, $\alpha=-6.25\times10^{-1}$, $\beta=\mathbf{-11.7}$, $\gamma=\mathbf{9.76}$.

Here, $SiN_x$ is a so-called silicon nitride, and the value of x indicates the degree of nitriding.

Here, the left-hand side of the above Expression (1) indicates a voltage to be applied to the both ends of the current steering element in order to set the current density of current that flows through the current steering element at 10000 A/cm². Thus, the inequality expression of the above Expression (1) represents a condition that causes the voltage to be applied to the both ends of the current steering element in order to set the current density of current that flows through the current steering element at 10000 A/cm², to be equal to or lower than the maximum value $V_0$, in other words, a condition that ensures that current having the current density of 10000 A/cm² flows through the current steering element even when the voltage applied to the both ends of the current steering element is equal to or lower than the maximum value $V_0$ (the relationship to be satisfied by the thickness d and the nitrogen composition ratio x). It is to be noted that 10000 A/cm² is an example of the lowest current density ($J_{min}$ (A/cm²)) of current necessary at the time of writing data into the variable resistance element connected to the current steering element in series.

On the other hand, the first term of the left-hand side of the above Expression (2) indicates a voltage to be applied to the both ends of the current steering element in order to set the current density of current that flows through the current steering element at 1000 A/cm², and the second term of the left-hand side of the above Expression (2) indicates half the voltage to be applied to the both ends of the current steering element in order to set the current density of current that flows through the current steering element at 10000 A/cm². Here, 1000 A/cm² is an example of the maximum current density ($J_{off}$(A/cm²)) allowable as current that flows through an unselected current steering element (in a shut off state), and is one-tenth of that of the current (10000 A/cm²) that flows through a selected (being conductive) current steering element. In addition, for the cross point storage device, it is known to be preferable to set the voltage applied between the both ends of the unselected current steering element as half the voltage applied between the both ends of the selected current steering element. Thus, the inequality expression of the above Expression (2) represents a condition that ensures that a current density of current that flows through the unselected current steering element is equal to or lower than one-tenth of a current density of current that flows through the selected current steering element (the relationship to be satisfied by the thickness d and the nitrogen composition ratio x).

With the above configuration, rectification caused by a potential barrier generated between the current steering layer adjacent to the first electrode and the second electrode is obtained, and thus it is possible to provide the current steering element that has characteristics which can prevent occurrence of write disturb even when electric pulses having different polarities are applied and can cause current necessary for change in resistance to flow through a selected variable resistance element, and which does not cause current necessary for change in resistance to flow through an unselected variable resistance element.

$SiN_x$ is a material that has been used in the semiconductor industry. Thus, it is easy to adapt the method of preservation and maintenance for a semiconductor manufacturing line and existing facilities and operational conditions for the facilities related to etching and the like, and thus it is possible to provide a current steering element with excellent productivity.

It is preferable here that the thickness d of the current steering layer is equal to or larger than 5 nm.

The above-described configuration allows sufficiently preventing occurrence of leak current attributed to a tunneling effect, in the current steering element, and thus it is possible to stabilize the characteristics of the current steering element.

In addition, it is preferable that the first electrode and the second electrode include tantalum nitride or α-tungsten.

With the above-described configuration, it is possible to further reduce bypass current flowing into the variable resistance element in a storage element other than a selected storage element at the time of writing data into the variable resistance element. This is a more preferable configuration for causing the storage element or the storage device to actually operate.

Furthermore, an aspect of the storage element according to the present invention is a storage element comprising: a variable resistance element which is non-volatile and has an electric resistance value reversibly changes in response to application of electric pulses having a positive polarity and a negative polarity; and the current steering element according to one of Claims 1 to 3, the current steering element being connected in series to the variable resistance element and suppressing passing current that flows when the electric pulses are applied to the variable resistance element.

With the above configuration, rectification caused by a potential barrier generated between the current steering layer adjacent to the first electrode and the second electrode is obtained, and thus it is possible to provide the storage element including the current steering element that has characteristics which can prevent occurrence of write disturb even when electric pulses having different polarities are applied and can cause current necessary for change in resistance to flow through a selected variable resistance element, and which does not cause current necessary for change in resistance to flow through an unselected variable resistance element.

Furthermore, an aspect of the storage element according to the present invention is a storage device comprising: a plurality of bit lines; a plurality of word lines each of which three-dimensionally crosses said plurality of bit lines; and a plurality of storage elements including said storage element, wherein each of said plurality of storage elements is provided at a corresponding one of crosspoints at which said plurality of bit lines and said plurality of word lines three-dimensionally cross each other, and has one end connected to a corresponding one of said plurality of bit lines and an other end connected to a corresponding one of said plurality of word lines.

With the above configuration, rectification caused by a potential barrier generated between the current steering layer adjacent to the first electrode and the second electrode is obtained, and thus it is possible to provide the storage device including the current steering element that has characteristics which can prevent occurrence of write disturb even when electric pulses having different polarities are applied and can cause current necessary for change in resistance to flow through a selected variable resistance element, and which does not cause current necessary for change in resistance to flow through an unselected variable resistance element.

Furthermore, the method of manufacturing a current steering element according to the present invention is a method of manufacturing a current steering element which includes: a first electrode; a second electrode; and a current steering layer including $SiN_x$ interposed between the first electrode and the second electrode, and which steers current that flows when electric pulses having a positive polarity and a negative polarity are applied, the method comprising: designing the current steering element by determining a thickness d and a nitrogen composition ratio x of the current steering layer; and manufacturing the current steering element according to the thickness d and the nitrogen composition ratio x determined in the designing, wherein the designing includes: obtaining: a lowest current density $J_{min}$ (A/cm$^2$) of current necessary to flow through the current steering element; a maximum allowable current density $J_{off}$ (A/cm$^2$) of current that flows through the current steering element when the current steering element is in a shut off state; and a maximum value $V_0$ (volt) of a voltage that can be applied between both ends of the current steering element; and determining the thickness d and the nitrogen composition ratio x which are in a range that satisfies Expression (3) and Expression (4) described below, using the current density $J_{min}$, the current density $J_{off}$, and the $V_0$ which have been obtained in the obtaining.

$(\ln(J_{min}(C \exp(\alpha d)\exp(\beta x))^{-1})/\gamma)^2 \leq V_0$     Expression (3)

$(\ln(J_{off}(C \exp(\alpha d)\exp(\beta x))^{-1})/\gamma)^2 - (\ln(J_{min}(C \exp(\alpha d)\exp(\beta x))^{-1})/\gamma)^2/2 \geq 0$     Expression (4), where $C=7.46\times10^{-2}$, $\alpha=-6.25\times10^{-1}$, $\beta=-11.7$, $\gamma=9.76$ With the above configuration, rectification caused by a potential barrier generated between the current steering layer adjacent to the first electrode and the second electrode is obtained, and thus it is possible to manufacture the current steering element that has characteristics which can prevent occurrence of write disturb even when electric pulses having different polarities are applied and can cause current necessary for change in resistance to flow through a selected variable resistance element, and which does not cause current necessary for change in resistance to flow through an unselected variable resistance element.

Advantageous Effects of Invention

The current steering element, the storage element, the storage device, and the method of manufacturing the current steering element according to the present invention produce an advantageous effect of providing the current steering element, the storage element, the storage device, and the method of manufacturing the current steering element which can prevent occurrence of write disturb even when electric pulses having different polarities are applied and can cause large current to flow through a variable resistance element, and with which data can be written without problem.

BRIEF DESCRIPTION OF DRAWINGS

FIG. 13A is a characteristic graph in the case where x=0.3 is satisfied, and FIG. 13B is a characteristic graph in the case where x=0.6 is satisfied.

FIG. 14A is a characteristic diagram which shows data of a sample including electrodes made of TaN and a current steering layer in which a nitrogen composition ratio x of $SiN_x$ and a thickness are changed. FIG. 14B is a characteristic diagram which shows data of a sample including electrodes made of TaN or W and current steering layers in which a nitrogen composition ratio x of $SiN_x$ is changed.

FIG. 25A is a characteristic diagram of a two-terminal device such as a varistor, and FIG. 25B is a characteristic diagram of a Schottky diode.

FIG. 28 is a flow chart which shows a detailed process of a manufacturing step S20 of FIG. 26.

DESCRIPTION OF EMBODIMENTS

Figure 1:
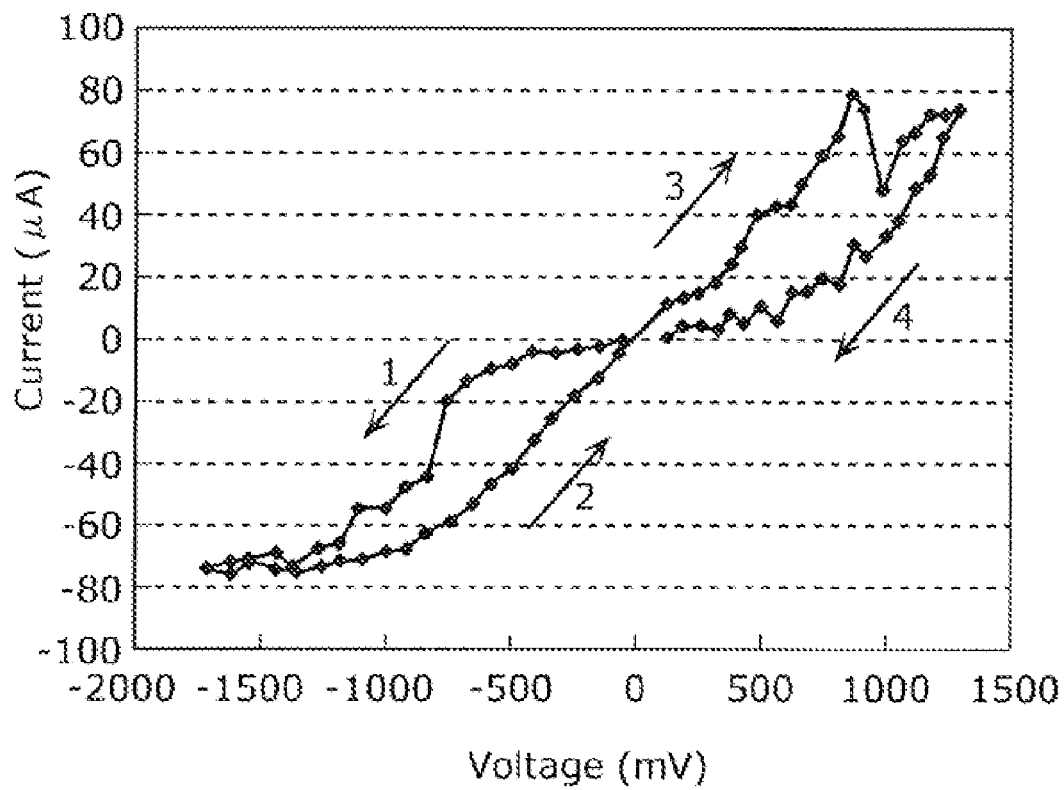
FIG. 1 is a characteristic diagram which shows a result of measuring voltage-current characteristics of a variable resistance element using tantalum oxide for a variable resistance material.

First, the configuration of a variable resistance element included in a storage element according to the present embodiment will be described in detail.

The variable resistance element includes a pair of electrodes facing each other and a thin film composed of a variable resistance material provided between the electrodes. Hereafter, the thin film is referred to as "variable resistance thin film". When a predetermined electric pulse is applied to the variable resistance thin film, the state of the variable resistance thin film changes between a predetermined low resistance state (hereinafter this state is simply referred to as "low resistance state") and a predetermined high resistance state (hereinafter this state is simply referred to as "high resistance state"). Here, the variable resistance thin film stays in the state subsequent to the change unless a predetermined electric pulse is applied. In the present embodiment, one of "0" and "1" of binary data is assigned to the low resistance state and the other is assigned to the high resistance state, and electric pulses having different polarities are applied so that the state of the variable resistance thin film is changed between the low resistance state and the high resistance state. Perovskite metal oxide, typical metal or transition metal oxide, and the like can be used as the variable resistance material for forming such a variable resistance thin film.

More specifically, the variable resistance material for forming a variable resistance thin film includes: Pr$_{(1-x)}$Ca$_x$MnO$_3$ (0<x<1), TiO$_2$, NiO$_x$ (x>0), ZrO$_x$ (x>0), FeO$_x$ (x>0), Cu$_x$O (x>0), AlOx (0<x<1.5), TaO$_x$ (0<x<2.5), or a substitution product, a mixture, or laminated structure thereof, and so on. The variable resistance material is, of course, not limited to these variable resistance materials.

The following describes a method of manufacturing a variable resistance element included in a storage element according to an embodiment of the present invention.

In forming a variable resistance element, an electrode (hereinafter this electrode is referred to as a "lower electrode"), a variable resistance thin film, and an electrode which is the counterpart of the lower electrode (hereinafter this electrode is referred to as an "upper electrode") are formed in this order on a main plane of a given substrate. First, film formation of the lower electrode is described. When platinum (Pt) is used as the material for the lower electrode, for example, although the condition for the film formation changes depending on the material for the electrode and the like to be used, DC magnetron sputtering is used, the pressure in the formation is set at 0.5 Pa, a DC power is set at 200 W, the flow ratio of argon (Ar) is set at 6 sccm, and time for the formation is adjusted so that the thickness is 20 to 100 nm. It is to be noted that the film formation method of the lower electrode is not limited to the sputtering, and so-called chemical vapor deposition method (CVD method), a spin coat method, or the like, may be used.

Next, a variable resistance thin film is formed on the main plane of the lower electrode. This film formation method also changes depending on the material for the variable resistance thin film to be used. For example, when tantalum oxide (TaO$_x$) is used as a material for the variable resistance thin film, a TaO$_x$ thin film is formed by performing reactive sputtering on a tantalum (Ta) target in mixed atmosphere of Ar and oxygen, using RF magnetron sputtering. More specifically, the pressure is set at 0.2 to 5 Pa, the temperature of the substrate is set at 20 to 400 degrees Celsius, the flow ratio of oxygen is set at 0.1 to 10%, the RF power is set at 150 to 300 W, and time for the formation is adjusted so that the thickness of the TaO$_x$ film is 1 to 300 nm. It is to be noted that the method of forming the variable resistance thin film is not limited to the sputtering method, and a so-called CVD method, a spin coat method, or the like, may be used.

Lastly, an upper electrode is formed on the main plane of the variable resistance thin film, using the sputtering method. Here, although the condition for the film formation of the upper electrode changes depending on the material for the electrode and the like to be used, when Pt is used as the material for the upper electrode, for example, DC magnetron sputtering is used in the same manner as in the film formation of the lower electrode, the pressure in the film formation is set at 0.5 Pa, a DC power is set at 200 W, the flow rate of argon (Ar) is set at 6 sccm, and time for the film formation is adjusted so that the thickness is 20 to 100 nm. It is to be noted that the film formation method of the upper electrode is not limited to the sputtering method, and the so-called chemical vapor deposition method (CVD method), the spin coat method, or the like, may be used.

FIG. 1 shows voltage-current characteristics of a variable resistance element having an electrode area of 0.5 μm$^2$, in which TaO$_x$ having a thickness of 50 nm is used as a variable resistance material. In the present experiment, a film of each of tantalum nitride (TaN), TaO$_x$, and Pt is formed and stacked in this order on the main plane of the substrate using the sputtering method, and an ordinary photolithography and dry etching are applied so that the variable resistance element is formed to be the target of measurement. In the measurement of FIG. 1, the voltage applied to the variable resistance element is changed in the following order: from 0 V to −1.8 V (the characteristic is shown as a curve indicated by the arrow 1); from −1.8 V to 0 V (the characteristic is shown as a curve indicated by the arrow 2); from 0 V to +1.3 V (the characteristic is shown as a curve indicated by the arrow 3); and from +1.3 V to 0 V (the characteristic is shown as a curve indicated by the arrow 4). In FIG. 1, change in the current value due to change in resistance of the variable resistance element can be seen at approximately −0.8 V (the characteristic is shown as a curve indicated by the arrow 1) and approximately +0.9 V (the characteristic is shown as a curve indicated by the arrow 3) in the range of the voltage applied to the variable resistance element; however, the actual current that flows into the variable resistance element at the time of resistance change is approximately a maximum of 80 μA. When it is assumed that the electrode area of the variable resistance element is 1 μm$^2$, 80 μA corresponds to 8000 A/cm$^2$. Accordingly, it is considered that the current density ($J_{min}$ (A/cm$^2$)) of a current necessary for writing data into the variable resistance element is at least 10000 A/cm$^2$, preferably 30000 A/cm$^2$ or higher, and more preferably 50000 A/cm$^2$ or higher. More specifically, the lowest current density $J_{min}$ (A/cm$^2$) of current necessary to flow into the current steering element is 10000 A/cm$^2$, preferably 30000 A/cm$^2$, and more preferably 50000 A/cm$^2$.

Next, the characteristic configuration of the variable resistance element according to the present embodiment will be described in detail.

In the present embodiment, the current steering element is formed by including a pair of electrodes facing each other and a current steering layer interposed therebetween. This configuration is the same as the configuration of the MIM diode or the MSM diode described above. In addition, the current steering element according to the present embodiment shows nonlinear electric resistance characteristics and the voltage-current characteristics that are substantially symmetrical to the polarity of an applied voltage. Thus, with the current steering element according to the present embodiment, it is possible to prevent occurrence of write disturb even when electric pulses having different polarities are applied.

In addition, the voltage-current characteristics of the current steering element according to the present embodiment depends heavily on a potential barrier generated between each of the electrodes and the current steering layer adjacent to the electrodes, and rectification is generated due to the potential barrier, so that nonlinear electric resistance characteristics are obtained. In the present embodiment, the current steering element is described which can cause large current to flow by liming the height of the potential barrier to a certain height or lower, effectively using the characteristics.

The following describes in detail a specific configuration of the current steering element according to the present embodiment with reference to the drawings.

Figure 2:
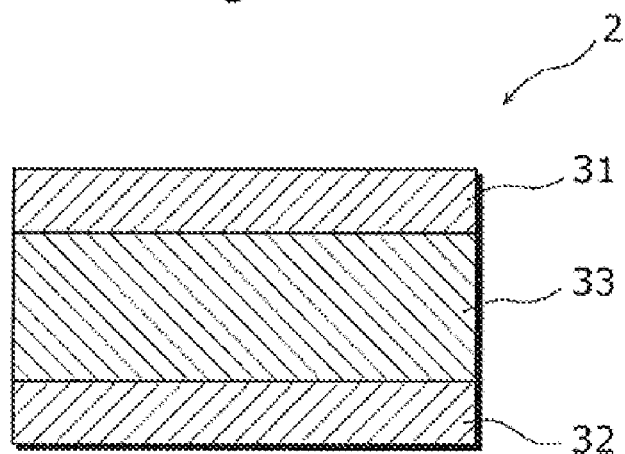
FIG. 2 is a cross sectional diagram which schematically shows a configuration of a current steering element according to an embodiment of the present invention.

FIG. 2 is a cross sectional diagram which schematically shows a configuration of the current steering element according to an embodiment of the present invention.

As shown in FIG. 2, a current steering element 2 includes: a first electrode 32; a second electrode 31; and a current steering layer 33 interposed between the first electrode 32 and the second electrode 31. Here, the first and second electrodes 32 and 31 include a metal such is as Al, Cu, Ti, W, Pt, Ir, Cr, Ni, Nb, and so on, or a mixture (alloy) or laminated structure of these metals.

Or, these first and second electrodes 32 and 31 include: a chemical compound having conductivity, such as TiN, TiW, TaN, TaSi$_2$, TaSiN, TiAlN, NbN, WN, WSi$_2$, WSiN, RuO$_2$, In$_2$O$_3$, SnO$_2$, IrO$_2$, and so on; or a mixture or laminated structure of these chemical compounds having conductivity. The materials included in the first and second electrodes 32 and 31 are, of course, not limited to these materials and any materials can be used as long as rectification is generated due to a potential barrier generated between the current steering layer 33 and the materials.

In the present embodiment, the current steering layer 33 includes SiN$_x$ (0<x≦0.85).

A silicon compound such as SiN$_x$ forms a tetrahedral amorphous semiconductor which forms tetrahedrally coordination. The tetrahedral amorphous semiconductor basically has a configuration similar to a configuration of single crystal silicon or germanium, and thus has characteristics that difference in configuration due to introduction of an element other than silicon is easily reflected to physical properties. For that reason, when the silicon compound is applied to the current steering layer 33, it is facilitated, due to the structure control role of the silicon compound, to control physical properties of the current steering layer 33 Therefore, this produces an advantageous effect of further facilitating control of a potential barrier generated between the first electrode 32 and the second electrode 31.

In particular, it is more preferable to use SiN$_x$ as the current steering layer 33 because a band gap can be continuously changed by changing the composition of nitrogen in the SiN$_x$, and thus it is possible to control the size of the potential barrier generated between the current steering layer 33 and each of the first electrode 32 and second electrode 31 adjacent to the current steering layer 33.

Furthermore, the SiN$_x$ includes, as its composition, silicon and nitrogen which are used quite generally in the manufacturing process of semiconductors, and is widely used in the current manufacturing process of semiconductors. Thus, no new impurity contamination due to introduction of SiN$_x$ occurs, and it is preferable for preservation and maintenance in the semiconductor manufacturing line. In addition, in fabrication, there are advantages that existing facilities can be easily adapted for film formation, etching, and so on, and it is possible to adapt the existing condition of film formation or etching, for the fabrication condition.

Now, in order to configure a cross point storage device into which data can be reliably written by applying electric pulses having different polarities, it is necessary that the current steering element is an element which shows nonlinear electric resistance characteristics and the voltage-current characteristics that are substantially symmetrical to the polarity of an applied voltage, and which is capable of causing current having a current density necessary for writing data into the variable resistance element to flow. In addition, from a point of view of miniaturization or further integration of a storage element, it is desirable that the current steering element can be miniaturized and variation in characteristics is small.

Based on the point of view, among two-terminal devices (an MIM diode, an MSM diode, a varistor, and so on, for example) applicable to a current steering element, the MIM diode is considered to be basically unsuitable for the purpose of causing large current constantly to flow due to the configuration of including an insulator between metals. In addition, the varistor is known as having characteristics attributed to crystal grain boundary, and since variation in characteristics based on the difference in grain diameter distribution of crystal occurs in principle, variation in operational characteristics cannot be avoided at the time of miniaturization. Thus the varistor is considered to be unfavorable as a current steering element in this regard. Furthermore, it is considered that, when using amorphous semiconductor, variation is characteristics attributed to the configuration of the semiconductor hardly occur in the MSM diode, and thus it is possible to avoid variation in operational characteristics at the time of miniaturization. However, there is no report of the MSM diode used for causing large current constantly to flow.

Figure 25A:
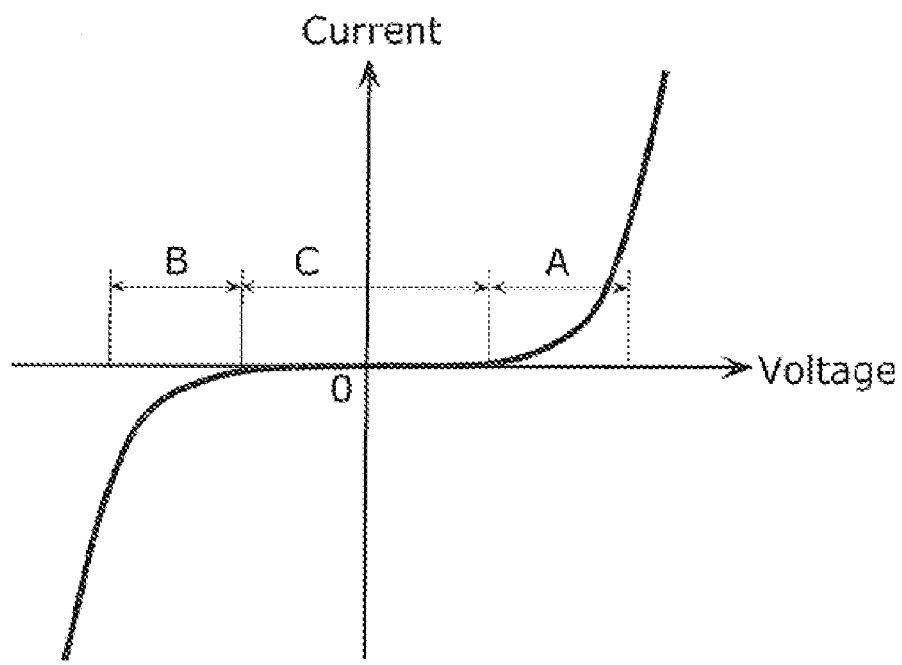
FIGS. 25A and 25B are characteristic diagrams which schematically show voltage-current characteristics of current steering elements.
Figure 25B:
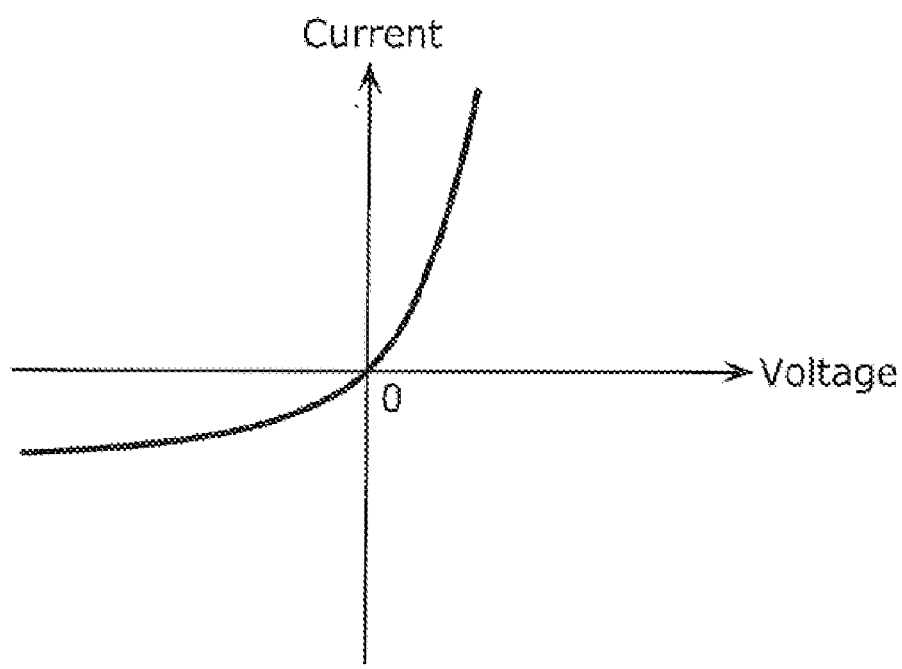

In the case where $SiN_x$ is applied to the current steering layer 33, the electrical conduction property of the current steering layer 33 significantly changes according to the nitrogen composition ratio x, as described above. More specifically, $SiN_x$ is an insulator in terms of a so-called stoicheiometric composition (x=1.33, that is, $Si_3N_4$); however, $SiN_x$ gradually changes to behave as a semiconductor when the nitrogen ratio decreases from the composition (in other words, when the nitrogen composition ratio x is reduced). Thus, it is possible to cause the current steering element 2 including the current steering layer 33 to function as the MSM diode, by appropriately controlling the nitrogen composition ratio x. Here, in the MSM diode, the electric resistance is significantly high in a range in which an applied voltage is equal to or lower than a first critical voltage (the lower limit voltage in the range A of FIG. 25A) and equal to or larger than a second critical voltage (the upper limit voltage in the range B of FIG. 25A), whereas the electric resistance rapidly decreases when exceeding the first critical voltage or falling below the second critical voltage. More specifically, the MSM diode has nonlinear electric resistance characteristics with which large current flows when an applied voltage exceeds the first critical voltage or falls below the second critical voltage. Hereafter, the state of which large current flows is referred to as "conduction state". In the present embodiment, bypass current is reliably suppressed by connecting in series the current steering element 2 having such electric resistance characteristics of an MSM diode to the variable resistance element 1.

As a result of keen examination, the inventors of the present invention found that it is possible to manufacture the current steering element 2 with which the current density of current that can be caused to flow in the conduction state of the MSM diode can be sufficiently increased and the current density not in the conduction state can be sufficiently reduced, by controlling the nitrogen composition ratio x in $SiN_x$ and the thickness of the current steering layer including $SiN_x$ so as to be a value within predetermined range. It is to be noted that an appropriate nitrogen composition ratio x in $SiN_x$ and an appropriate thickness of the current steering layer including $SiN_x$ will be described later in detail.

The following describes a method of manufacturing a variable resistance element according to an embodiment of the present invention.

When manufacturing a current steering element, the first electrode 32 is first formed on the main plane of a predetermined substrate (Step S21 in FIG. 28 described later). When tungsten (W) is used as the material for the lower electrode, for example, although the condition for the film formation of the first electrode 32 changes depending on the material for the electrode and the like to be used, DC magnetron sputtering is used, the substrate temperature is set at 20 to 25 degrees Celsius, the flow rate of Ar is set at 50 sccm, the DC power is set at 200 to 300 W, the pressure in the film formation is set at 0.4 to 0.8 Pa, and time for the film formation is adjusted so that the thickness is 20 to 100 nm.

Next, a $SiN_x$ film, as the current steering layer 33, is formed on the main plane of the first electrode 32 (Step S22 in FIG. 28 described later). In this film formation, a technique of performing sputtering on a polycrystalline silicon target in mixed gas atmosphere of Ar and nitrogen (a so-called reactive sputtering method) is used, for example. As typical film formation condition, the pressure is set at 0.08 to 2 Pa, the substrate temperature is set at 20 to 300 degrees Celsius, the flow ratio of nitrogen gas (the flow ratio of nitrogen with respect to the total flow ratio of Ar and nitrogen) is set at 0 to 40%, the DC power is set at 100 to 1300 W, and time for the film formation is adjusted so that the thickness of the $SiN_x$ film is 5 to 20 nm.

Lastly, W is formed, as the second electrode 31, on the main plane of the current steering layer 33, for example (Step S23 in FIG. 28 described later). For the film formation of W, the DC magnetron sputtering is used, the substrate temperature is set at 20 to 25 degrees Celsius, the flow rate of Ar is set at 50 sccm, the DC power is set at 200 to 300 W, the pressure at the time of the film formation is set at 0.4 to 0.8 Pa, and time for the film formation is adjusted so that the thickness is 20 to 100 nm.

In the present embodiment, the nitrogen composition ratio x in the $SiN_x$ film can arbitrarily be changed by changing the condition for performing sputtering on the polycrystalline silicon target (the gas flow ratio of Ar and nitrogen, and so on).

Figure 3:
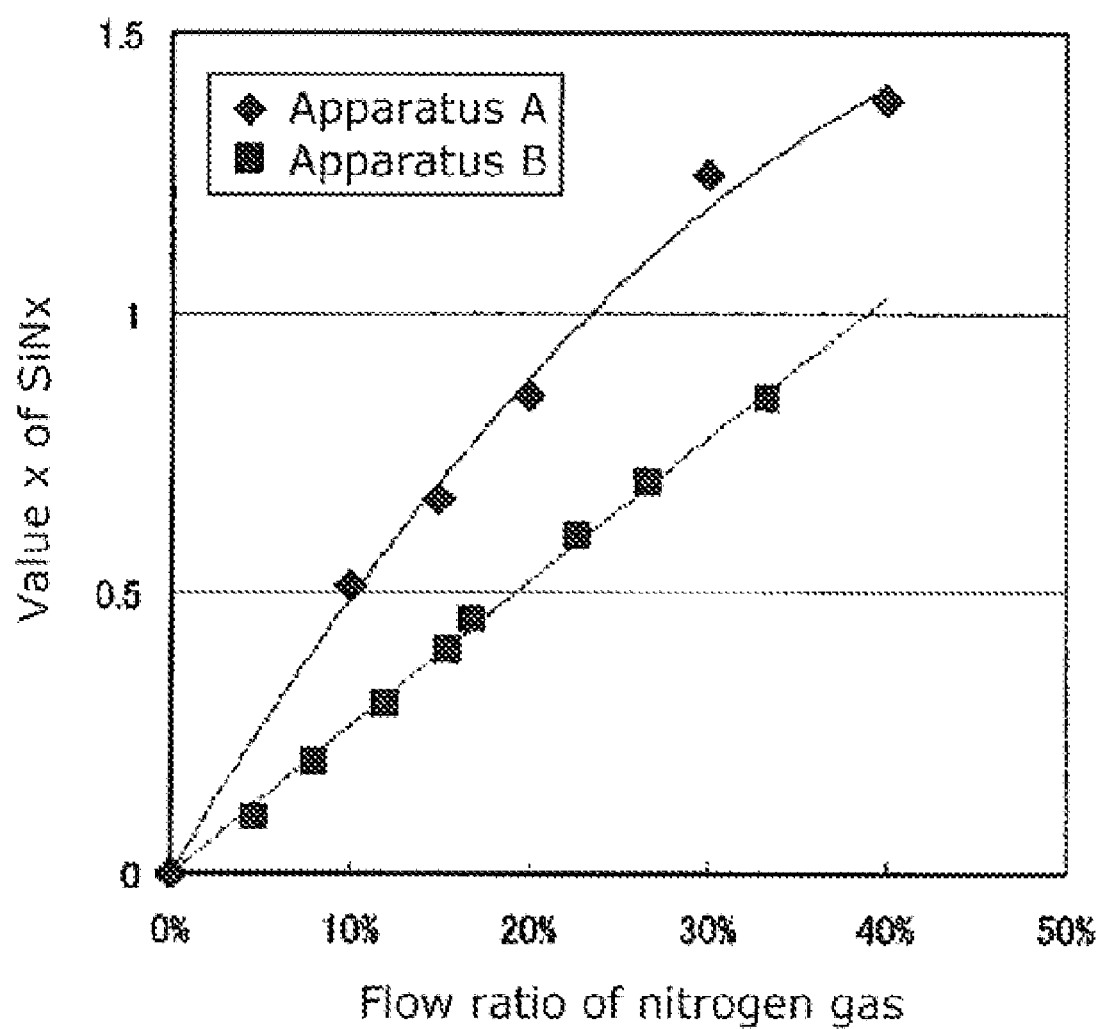
FIG. 3 is a correlation diagram which shows a result of measuring a nitrogen composition ratio x in $SiN_x$ films formed by changing the flow ratio of nitrogen gas, using Rutherford backscattering spectrometry.

FIG. 3 is a correlation graph which shows a result of measuring a nitrogen composition ratio x of $SiN_x$ films formed by changing the flow ratio of nitrogen gas, using Rutherford backscattering spectrometry. In FIG. 3, the horizontal axis indicates the flow ratio of nitrogen gas (the flow ratio of nitrogen with respect to the total flow ratio of Ar and nitrogen) and the vertical axis indicates the value x of $SiN_x$ films. It is to be noted that, FIG. 3 shows data related to a SiNx film formed using two kinds of DC sputtering film formation apparatus (hereinafter referred to as an apparatus A and an apparatus B). Here, the result of measurement using the apparatus A shows the result of measuring a sample formed in the following settings: a polycrystalline silicon target having a diameter of 150 mm is used; the pressure is 0.4 Pa; the substrate temperature is 20 degrees Celsius, the DC power is 300 W. Furthermore, the result of measurement using the apparatus B shows the result of measuring a sample formed in the following settings: a polycrystalline silicon target having a diameter of 300 mm is used; the total gas flow ratio is 15 sccm (the pressure is approximately 0.08 to 0.1 Pa); the substrate temperature is 20 degrees Celsius, the DC power is 1000 to 1300 W.

As shown in FIG. 3, in both cases of using the film formation apparatus A and B, it is possible to continuously change the nitrogen composition ratio x of the $SiN_x$ film, by continuously changing the flow ratio of the nitrogen gas from 0% to 40%. As described above, it is possible to continuously change the band gap by changing the composition of the nitrogen of the $SiN_x$ film with use of the flow ratio of the nitrogen gas. With this, it is possible to appropriately control the size of the potential barrier generated between the current steering layer 33 and each of the first electrode 32 and second electrode 31 adjacent to the current steering layer 33. This makes it possible to sufficiently increase the current density of current that can be caused to flow in the conduction state, while adding, to the current steering element 2, electric resistance characteristics similar to the MSM diode.

The following describes the content of speculation for an appropriate nitrogen composition ratio x of the $SiN_x$.

Figure 4:
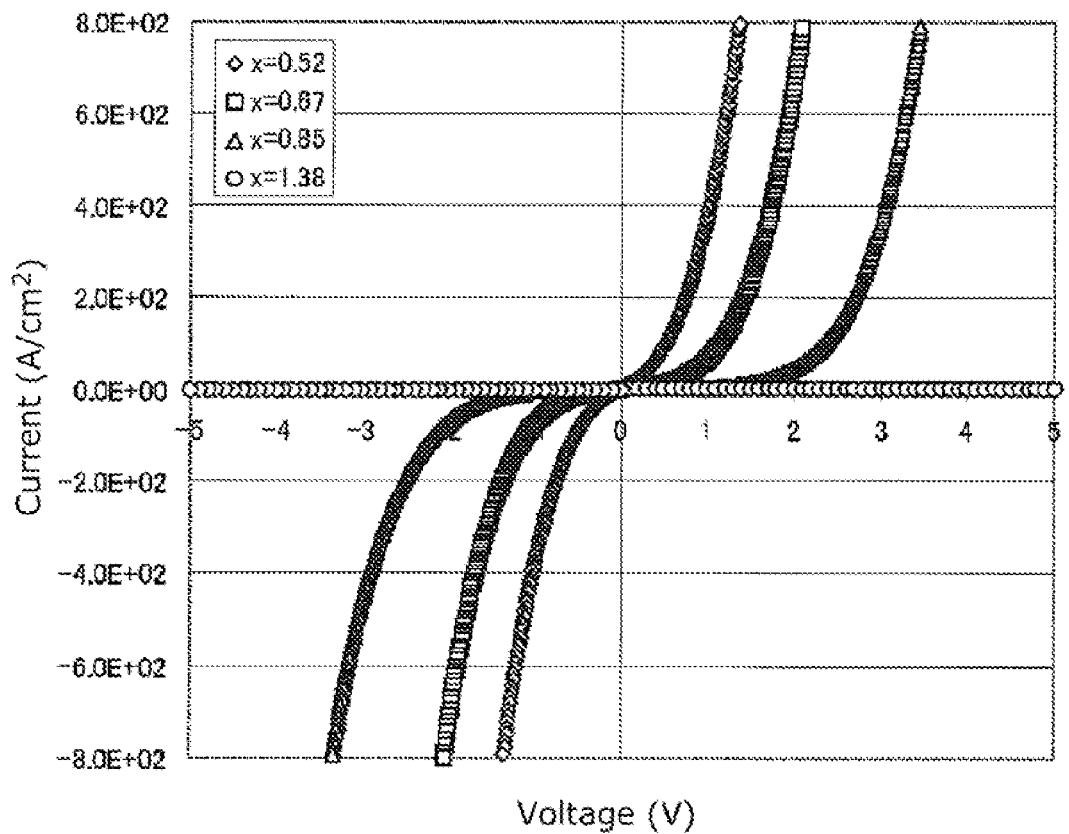
FIG. 4 is a characteristic diagram which shows a result of measuring voltage-current characteristics of a current steering element including: a current steering layer composed of $SiN_x$ and having a thickness of 20 nm; and a pair of electrodes composed of platinum (Pt).

FIG. 4 is a characteristic graph which shows a result of measuring voltage-current characteristics of a current steering element including: a current steering layer composed of $SiN_x$ and having a thickness of 20 nm; and a pair of electrodes composed of platinum (Pt). It is to be noted that, in FIG. 4, the horizontal axis indicates an applied voltage to the current steering element and the vertical axis indicates a current value flowing into the current steering element.

In this experiment, the current steering element 2 is formed by forming a Pt thin film and a $SiN_x$ thin film on the main plane of the substrate using the sputtering method, and then forming a Pt thin film through a metal mask including a circular hole having a diameter of 100 μm using the sputtering method. Here, the $SiN_x$ thin film is formed by performing sputtering with a polycrystalline silicon target in mixed gas atmosphere of argon and nitrogen. In addition, the nitrogen composition ratio x of the $SiN_x$ thin film is changed by changing a sputtering condition, such as the gas flow ratio of argon and nitrogen. Furthermore, the nitrogen composition ratio x of the $SiN_x$ thin film is obtained by Rutherford backscattering spectrometry. It is to be noted that, as shown in FIG. 4, four kinds of $SiN_x$ thin films each having different nitrogen composition ratio x are formed by changing a sputtering condition, in this experiment. Here, the nitrogen composition ratios x were 0.52, 0.67, 0.85, and 1.38, respectively. It is to be noted that, in this experiment, since the size of electrodes included in the current steering element is defined by a metal mask including a circular hole having a diameter of 100 μm, current of approximately several A is necessary for causing current of approximately 10000 A/cm$^2$ to actually flow, which is in an unmeasurable region, and thus data is compared using a standard of the case where the current density is 500 A/cm$^2$.

As shown in FIG. 4, it is found that the current steering element 2 including: the current steering layer 33 including $SiN_x$; and the first and second electrodes 32 and 31 including Pt, is an element which shows nonlinear electric resistance characteristics and which has voltage-current characteristics substantially symmetrical with respect to the polarity of an applied voltage. Furthermore, it is found that, when $SiN_x$ is applied to the current steering layer 33, the voltage that causes the conduction state increases correspondingly as the potential barrier generated between the current steering layer 33 and each of the first and second electrodes 32 and 31 adjacent to the current steering layer 33 increases as the nitrogen composition ratio x increases Furthermore, it is speculated, from FIG. 4, that when the nitrogen composition ratio is equal to or smaller than 0.85, the current density well exceeds 500 A/cm$^2$ even when the voltage applied between the first electrode 32 and the second electrode 31 is lower than 4 V, and further larger current density can be obtained by further applying voltage between the first electrode 32 and the second electrode 31. It is found, however, that when the nitrogen composition ratio x is 1.38, the conduction state cannot be obtained even when the applied voltage is 5V, and when the applied voltage is further increased, the current steering element 2 itself is broken before the conduction state is obtained. This indicates that the band gap of the current steering layer 33 is significantly increased by increasing the nitrogen composition ratio x, and as a result, the current steering layer 33 becomes an insulator. Thus, it is found that it is preferable that the nitrogen composition ratio x is above 0 and equal to or smaller than 0.85 when $SiN_x$ is applied to the current steering layer 33. When this configuration is applied, the current steering layer 33 functions as a semiconductor and the current steering element 2 functions as an MSM diode.

The voltage-current characteristics of the current steering element 2 including the current steering layer 33 made of $SiN_x$ shows the same characteristics even when a material other than Pt is used as the electrode.

Figure 5:
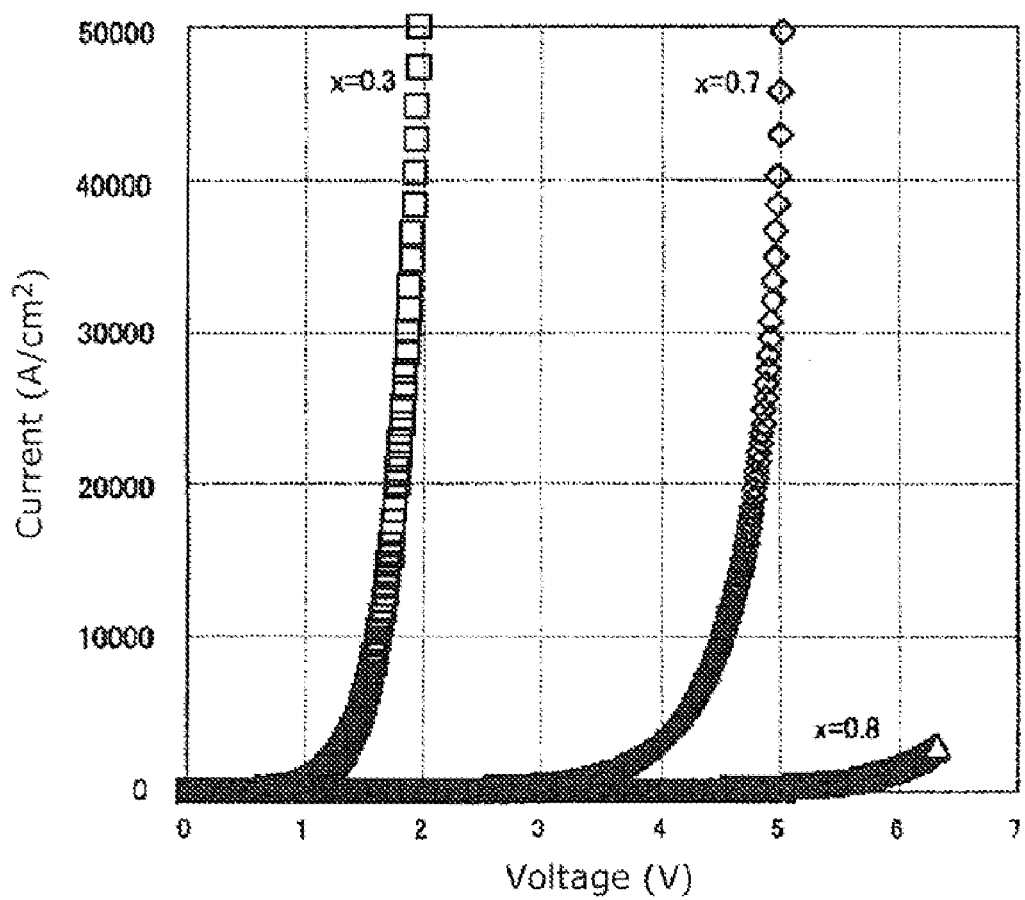
FIG. 5 is a characteristic diagram which shows a result of measuring voltage-current characteristics of a current steering element including: a current steering layer composed of $SiN_x$ and having a thickness of 10 nm; and a pair of electrodes composed of tantalum nitride (TaN).

FIG. 5 is a characteristic graph which shows a result of measuring voltage-current characteristics of a current steering element including: a current steering layer composed of $SiN_x$ and having a thickness of 10 nm; and a pair of electrodes composed of tantalum nitride (TaN). It is to be noted that, FIG. 5 shows the voltage-current characteristics when the nitrogen composition ratio x is 0.3, 0.7, and 0.8. Furthermore, in FIG. 5, illustration of the voltage-current characteristic in the case where the polarity of an applied voltage is negative is omitted for convenience sake.

In the present experiment, a film of each of TaN, $SiN_x$, and TaN is formed and stacked in this order on the main plane of the substrate, using the sputtering method, and an ordinary photolithography and dry etching are applied so that the current steering element 2 having an electrode area of 1 square micrometer is formed to be the target of measurement.

As shown in FIG. 5, it is found that, by setting the nitrogen composition ratio x of $SiN_x$ from 0.3 to 0.7, the voltage that causes the conduction state increases by approximately 3V while showing the electric resistance characteristics same as the electric resistance characteristics of the MSM diode, and in each case, it is possible to obtain large current density that exceeds 10000 A/cm$^2$ (an example of the lowest current density $J_{min}$ (A/cm$^2$) described above). Here, as shown by comparing with FIG. 4 which shows the voltage-current characteristic of the current steering element having an electrode of Pt, it is possible, using the current steering element having an electrode of TaN, to cause current of a significantly large current density to flow compared to the case of the current steering element having an electrode of Pt. Thus, TaN is one of preferable materials for the electrode of the current steering element including a current steering layer of $SiN_x$.

On the other hand, as shown in FIG. 5, it is found that, when setting the nitrogen composition ratio x of $SiN_x$ at 0.8, it is possible to cause current having a large current density of approximately 3000 A/cm$^2$ to flow in the case where the applied voltage is approximately 6.3 V; however, the current steering element 2 is broken (short circuit) when the applied voltage is further increased. It is considered that this phenomenon is caused due to the appearance of insulation characteristics of $SiN_x$ that is basically an insulator in terms of a so-called stoicheiometric composition, indicating that it is preferable that the nitrogen composition ration is set at 0.8 or smaller when it is necessary to cause current having a higher current density to flow. Thus, when forming a current steering element including a pair of electrodes including tantalum nitride (TaN), it is preferable that the nitrogen composition ratio x is set at equal to or smaller than 0.7 in order to obtain a large current density exceeding 10000 A/cm$^2$, for example.

Figure 6:
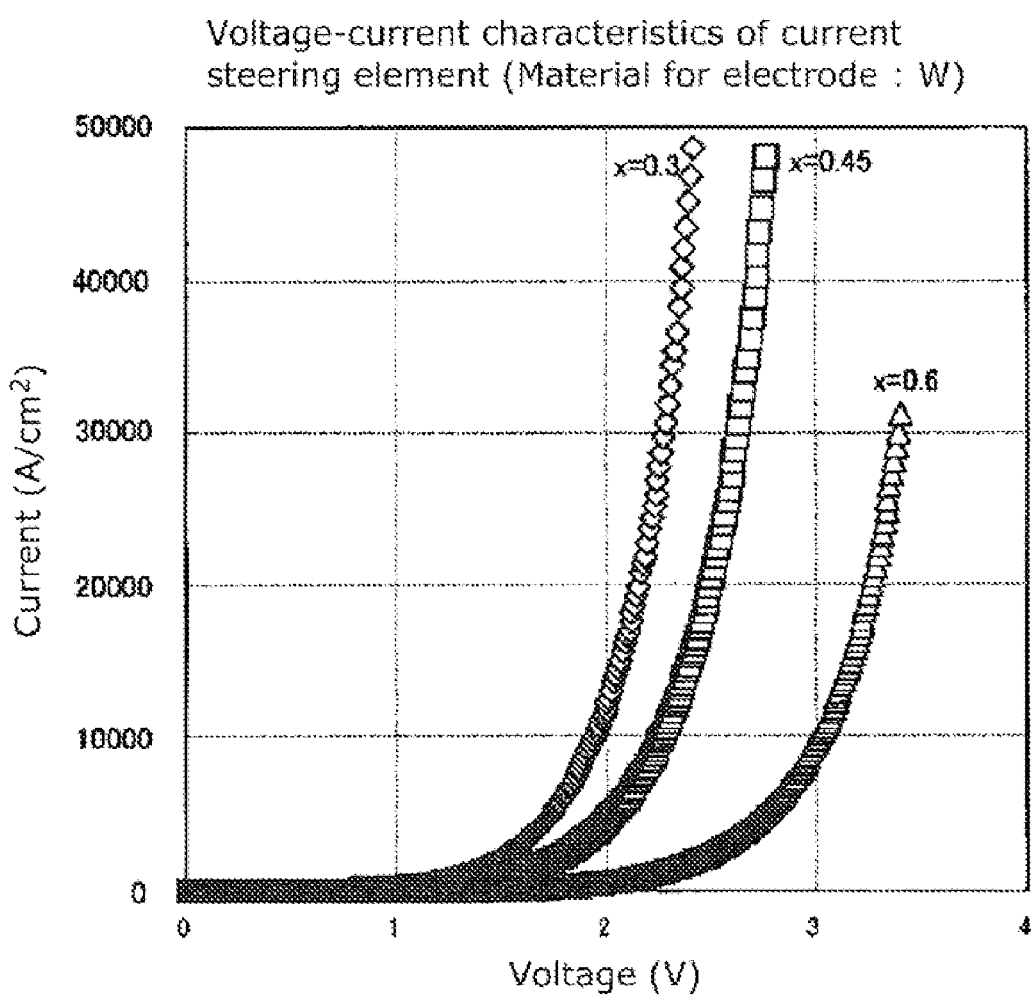
FIG. 6 is a characteristic diagram which shows a result of measuring voltage-current characteristics of a current steering element including: a current steering layer composed of $SiN_x$ and having a thickness of 10 nm; and a pair of electrodes composed of tungsten (W).

FIG. 6 is a characteristic graph which shows a result of measuring voltage-current characteristics of a current steering element including: a current steering layer composed of $SiN_x$ and having a thickness of 10 nm; and a pair of electrodes composed of tungsten (W). It is to be noted that the voltage-current characteristics when the nitrogen composition ratio x of $SiN_x$ is 0.3, 0.45, and 0.6 are shown in FIG. 6. In addition, illustration of the voltage-current characteristics in the case where the polarity of an applied voltage is negative is omitted for convenience sake in FIG. 6 as well.

In the present experiment, a film of each of W, $SiN_x$, and W is formed and stacked in this order on the main plane of the substrate, using the sputtering method, and an ordinary photolithography and dry etching are applied so that the current steering element 2 having an electrode area of 1 square micron meter is formed to be the target of measurement.

As shown in FIG. 6, also in the case where W is used as the electrode material, it is found that, by setting the nitrogen composition ratio x of $SiN_x$ from 0.3 to 0.6, the voltage that causes the conduction state increases by approximately 1.2 V while showing the electric resistance characteristics same as the electric resistance characteristics of the MSM diode, it is possible to obtain a large current density that exceeds 10000 A/cm$^2$ (an example of the lowest current density $J_{min}$ (A/cm$^2$)

described above), in the same manner as in the case where TaN is used as the electrode material. In addition, when comparing the case where the electrode material is TaN and the case where the electrode material is W, when the nitrogen composition ratio x of $SiN_x$ is the same in those cases, the voltage-current characteristics of the current steering element show practically the same characteristics, although the current value for the same voltage is slightly larger in the case where the electrode material is TaN. Therefore, it is preferable that the nitrogen composition ratio x is set at equal to or smaller than 0.7 when forming a current steering element including a pair of electrodes including tungsten (W) as well, in the same manner as in the case where the electrode material is TaN, in order to obtain a large current density exceeding 10000 $A/cm^2$.

The following describes the property of dependency on electrode material of the characteristics of a current steering element when tungsten is applied as the electrode material.

Figure 7:
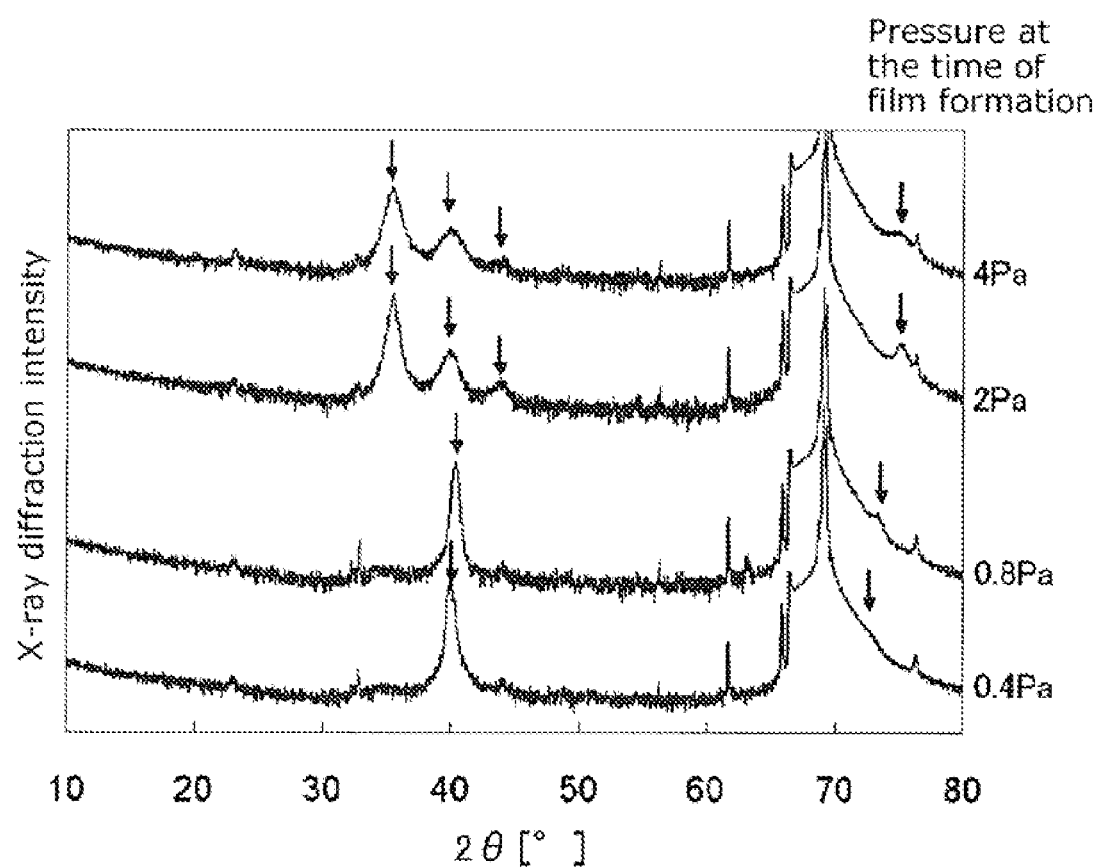
FIG. 7 is a graph which shows an X-ray diffraction pattern of W of a film formed using DC magnetron sputtering.
Figure 8A:
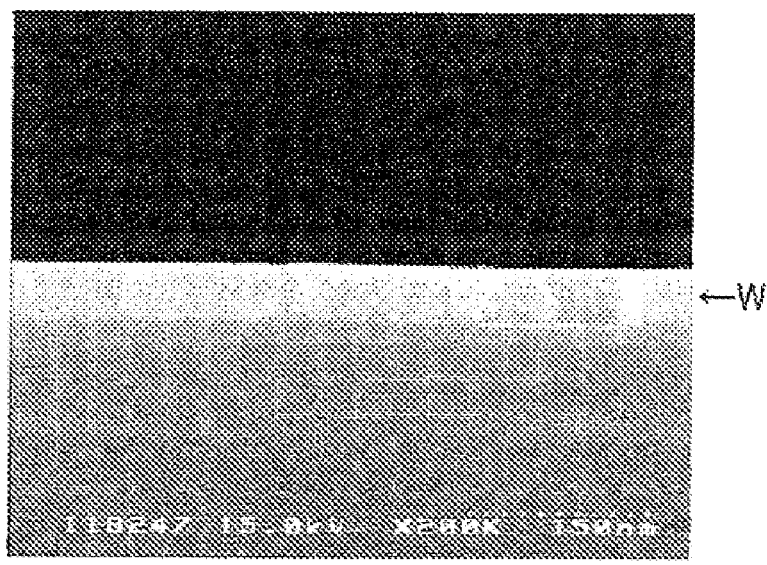
FIG. 8A is a cross-sectional photograph taken in an SEM observation for a film of W.
Figure 8B:
FIG. 8B is a top view photograph viewed obliquely from above and taken in the SEM observation for the film of W.
Figure 9A:
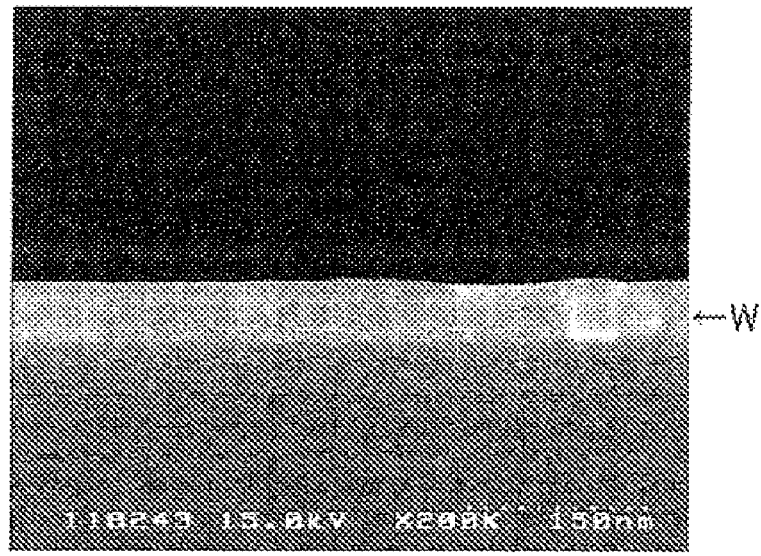
FIG. 9A is a cross-sectional photograph taken in an SEM observation for a film of W.
Figure 9B:
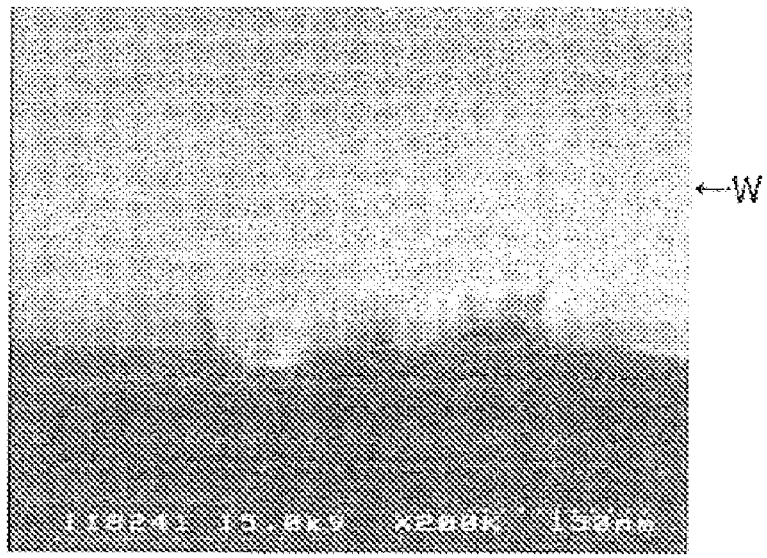
FIG. 9B is a top view photograph viewed obliquely from above and taken in the SEM observation for the film of W.
Figure 10A:
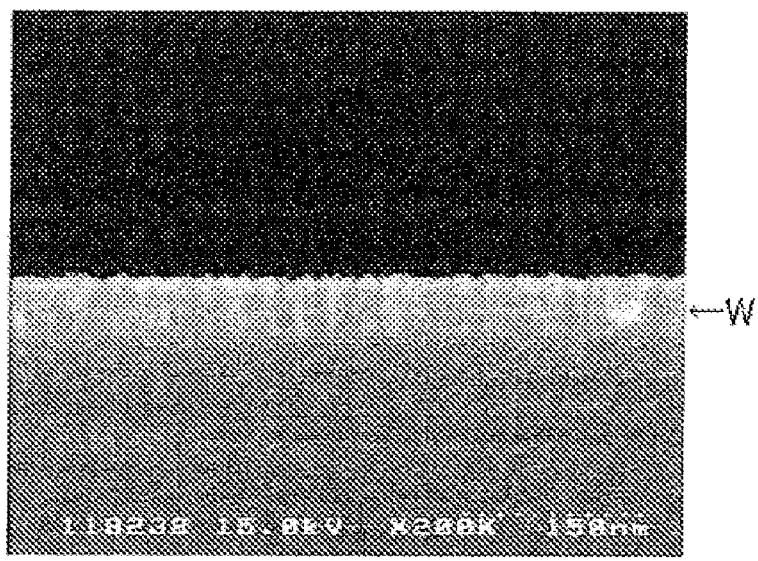
FIG. 10A is a cross-sectional photograph taken in an SEM observation for a film of W.
Figure 10B:
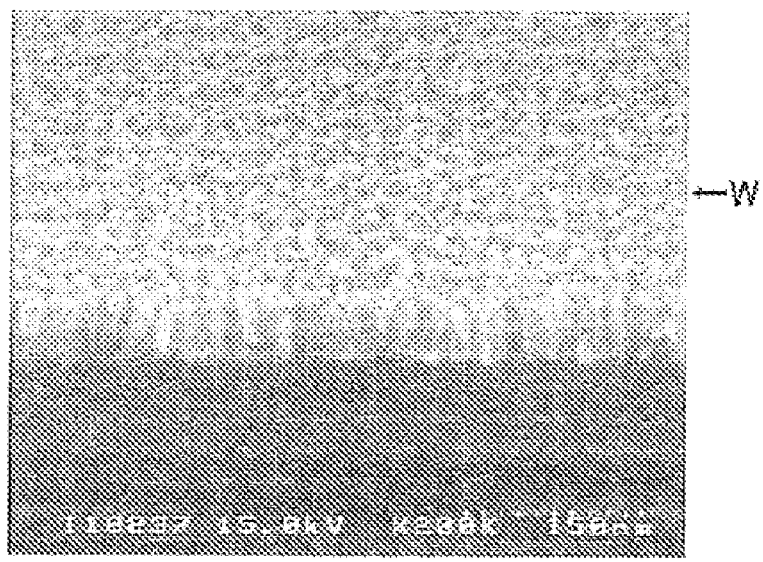
FIG. 10B is a top view photograph viewed obliquely from above and taken in the SEM observation for the film of W.
Figure 11A:
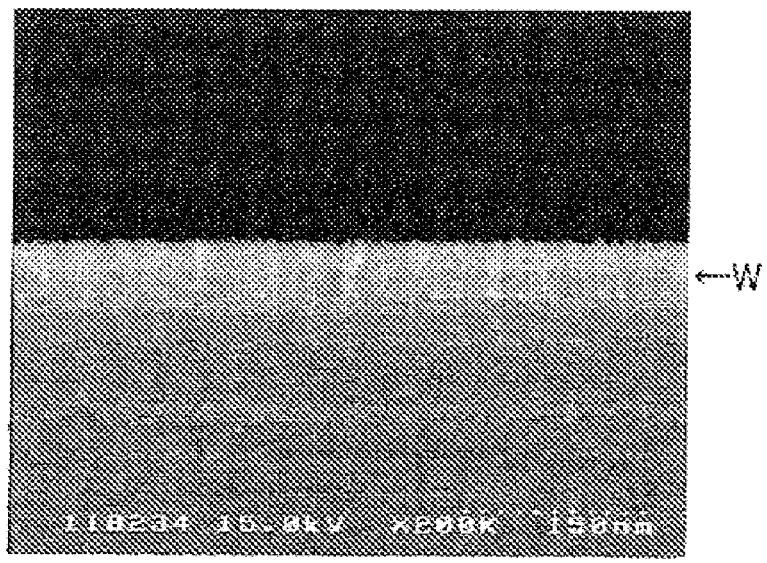
FIG. 11A is a cross-sectional photograph taken in an SEM observation for a film of W.
Figure 11B:
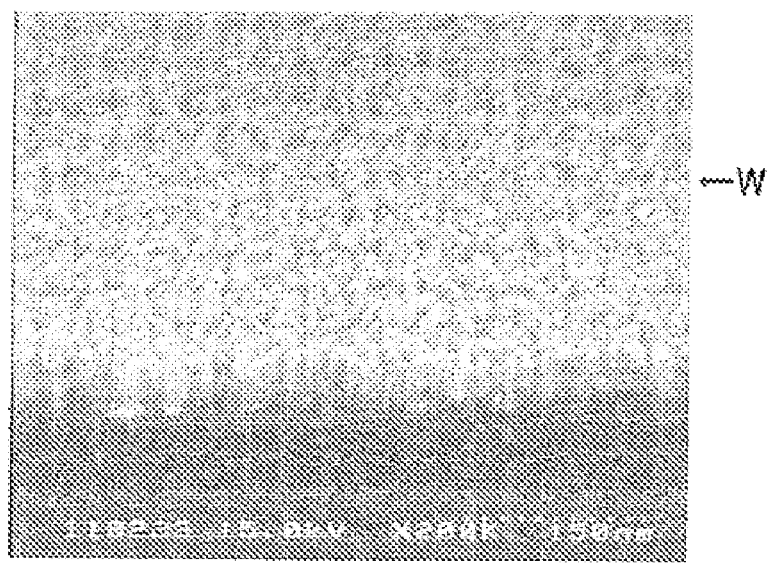
FIG. 11B is a top view photograph viewed obliquely from above and taken in the SEM observation for the film of W.

FIG. 7 shows an X-ray diffraction pattern of tungsten (W) of a film formed using the DC magnetron sputtering, which shows an X-ray diffraction intensity when X-ray is caused to be incident on a sample of the tungsten thin film at an incident angle of one degree, and an angle of detector (θ is an angle from an extended line of the incident X ray to the angle of the detector) is changed. In the sample, the W film is formed by performing sputtering on the W target in Ar gas atmosphere. In addition, a sample is formed for each of the following four conditions: a pressure is 0.4 Pa; 0.8 Pa; 2 Pa; and 4 Pa, by setting other film formation conditions as follows: the substrate temperature is set at 20 to 25 degrees Celsius, the Ar flow rate is set at 50 sccm, and the DC power is set at 200 to 300 W.

FIG. 7 shows that the configuration of the W film differs depending on the pressure at the time of film formation. When the pressure at the time of film formation is 0.4 Pa or 0.8 Pa, a group of peaks (two peaks at 40.3° and 73.2° indicated by down arrows in the diagram) attributed to α-tungsten (α-W) can be seen in the X-ray diffraction pattern. From this fact, it is considered that W is a thin film made of α-W having a body-centered, cubic lattice (bcc) structure. On the other hand, when the pressure at the time of film formation is 2 Pa or 4 Pa, the group of peaks attributed to α-tungsten becomes smaller or disappears, while a group of peaks (four peaks of 35.5°, 39.9°, 43.9°, and 75.2° indicated by down arrows in the diagram) attributed to β-tungsten (β-W) having an A15 structure appears and increases, and thus it is considered that a W thin film composed of β-W is formed.

Here, analysis using the X-ray diffraction method revealed the presence of α-W and β-W; however, the analysis can be conducted by an electron beam diffraction pattern using a transmission electron microscope.

FIG. 8A and FIG. 8B, FIG. 9A and FIG. 9B, FIG. 10A and FIG. 10B, and FIG. 11A and FIG. 11B are SEM photomicrographs of films of W having a thickness of approximately 50 nm, which are formed in the above-described four conditions. FIG. 8A, FIG. 9A, FIG. 10A, and FIG. 11A are photographs taken in SEM observation for cross sectional views of the films of W when the pressures at the time of film formation of W are 0.4 Pa, 0.8 Pa, 2 Pa, and 4 Pa, respectively. FIG. 8B, FIG. 9B, FIG. 10B, and FIG. 11B are photographs taken in SEM observation of surfaces of the films of W viewed obliquely from above when the pressures at the time of film formation of W are 0.4 Pa, 0.8 Pa, 2 Pa, and 4 Pa, respectively. It is to be noted that the film of W is indicated in the diagram by "← W" in FIG. 8A to FIG. 11B. These photographs show that the structure of the film of W differs depending on the pressure at the time of film formation, in the same manner as in FIGS. 9A and 9B. When the pressure at the time of film formation is 0.4 Pa (FIGS. 8A and 8B) or 0.8 Pa (FIGS. 9A and 9B), that is, in the case of α-W, it is observed that W has a dense film structure and the surface is smooth. On the other hand, when the pressure at the time of film formation is 2 Pa (FIGS. 10A and 10B) or 4 Pa (FIGS. 11A and 11B), the film of W has a columnar structure, and irregularity is seen on the surface.

Figure 12:
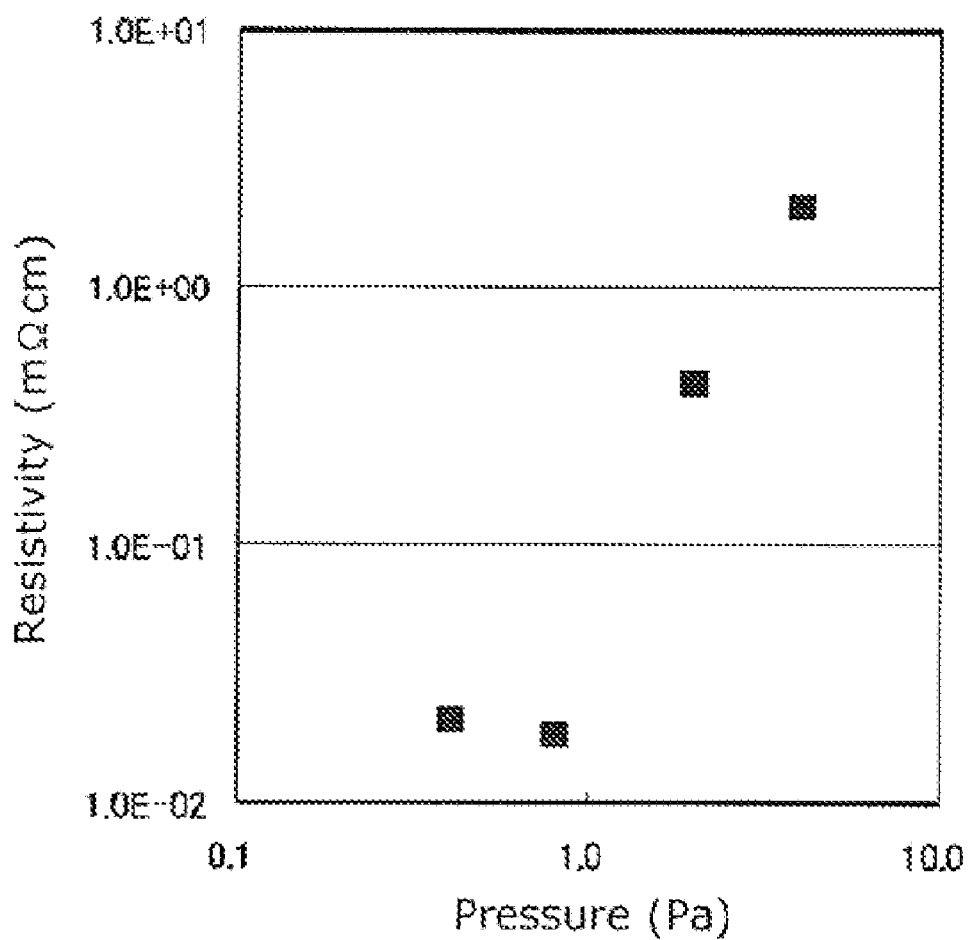
FIG. 12 is a characteristic diagram which shows a result of measuring resistivity of four kinds of films of W.

FIG. 12 shows a result of measuring resistivity of the four kinds of films of W. It is indicated that the resistivity of the film of W differs depending on the pressure at the time of film formation, by reflecting the change in the structures as shown in FIG. 7 or FIG. 8A to FIG. 11B. More specifically, as show in FIG. 12, when the pressure at the time of film formation is 0.4 Pa or 0.8 Pa, that is, in the case of α-W, the resistivity is approximately $2\times10^{-2}$ mΩcm, whereas the resistivity when the pressure at the time of film formation is 2 Pa is $4\times10^{-1}$ mΩcm and the resistivity when the pressure is 4 Pa is 2 mΩcm.

Figure 13A:
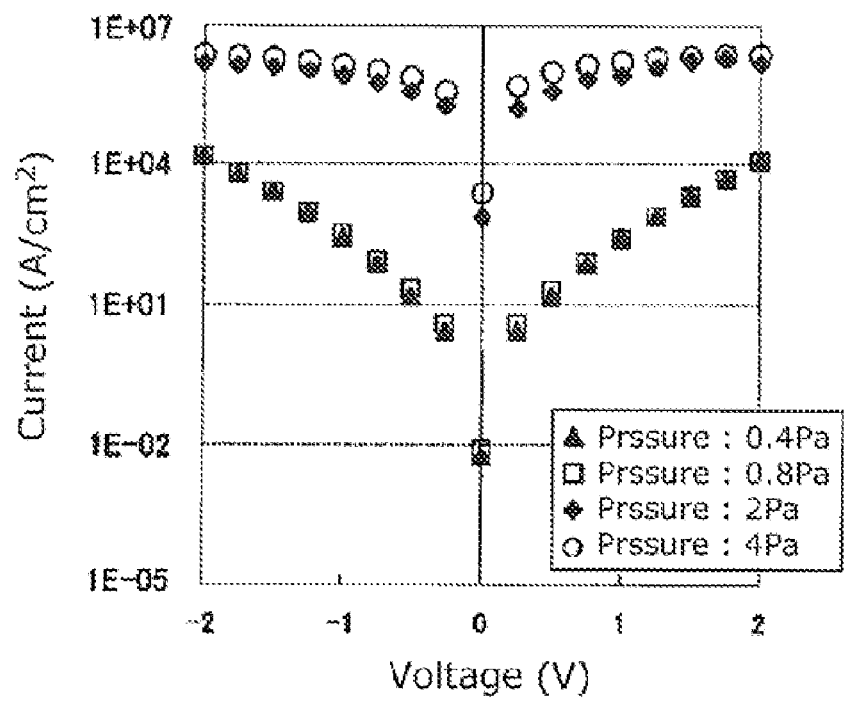
FIGS. 13A and 13B are characteristic diagrams which show a result of measuring voltage-current characteristics of current steering elements including: current steering layers composed of $SiN_x$ and having a thickness of 10 nm; and a pair of electrodes composed of W.
Figure 13B:
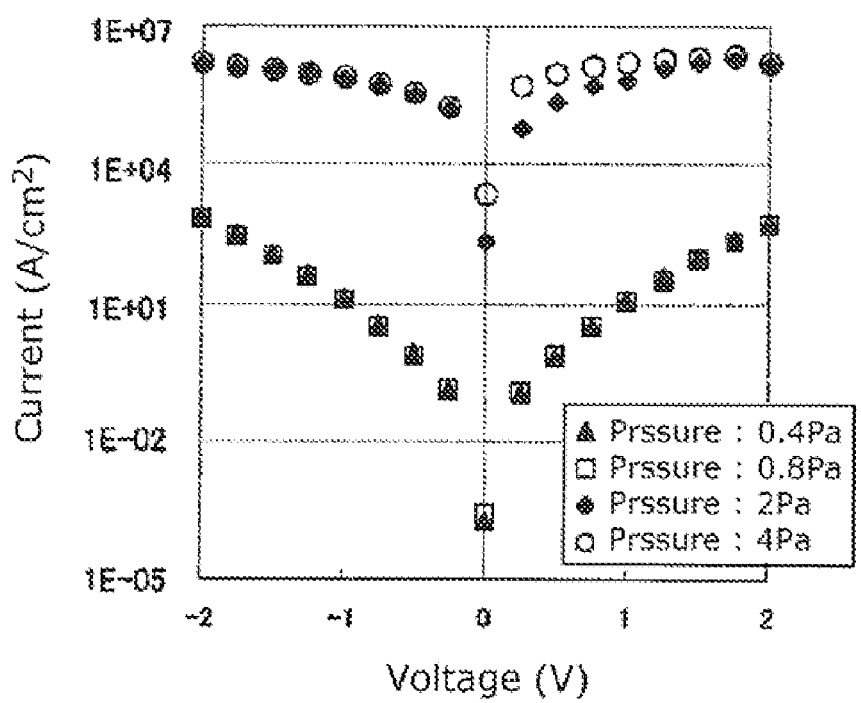

FIGS. 13A and 13B are characteristic graphs which show results of measuring voltage-current characteristics of current steering elements for every 0.25 V, which includes: a current steering layer composed of $SiN_x$ and having a thickness of 10 nm; and a pair of electrodes composed of W. The horizontal axis indicates an applied voltage to the current steering element and the vertical axis indicates an absolute value of current flowing into the current steering element. Here, FIG. 13A shows voltage-current characteristics when the nitrogen composition ratio x of the $SiN_x$ is 0.3 and FIG. 13B shows voltage-current characteristics when the nitrogen composition ratio x of the $SiN_x$ is 0.6, in which the above-described four conditions (the pressure=0.4 sPa, 0.8 Pa, 2 Pa, and 4 Pa) for film formation of W are used. It is to be noted that, the method of forming the current steering element 2 is the same as the method of forming the current steering element that is the target of measurement in FIG. 6. It is shown that, since the voltage-current characteristics, when the pressure at the time of film formation of a W electrode is 0.8 Pa, shows practically the same characteristics when the pressure at the time of film formation of a W electrode is 0.4 Pa, the current steering element including the electrode material of α-W shows the voltage-current characteristic that is preferable as a current steering element and it is possible to obtain a large current density that exceeds 10000 $A/cm^2$ as already shown in FIG. 6. On the other hand, when the pressure at the time of film formation of a W electrode is 2 Pa or 4 Pa, that is, when the electrode material is mainly composed of β-W, significantly large current flows already when an applied voltage to the current steering element is ±0.5 V, irrespective of the nitrogen composition ratio x of $SiN_x$ included in the current steering layer. Thus, leak current between electrodes is significantly large irrespective of positive or negative of an applied voltage in the current steering element, and the current steering element does not show the voltage-current characteristic shown when the pressure at the time of film formation of the W electrode is 0.4 Pa or 0.8 Pa. It is considered that this is because a potential barrier is not generated between $SiN_x$ included in the current steering layer and the W electrode irrespective of the nitrogen composition ratio x, when the pressure at the time of film formation of the W electrode is 2 Pa or 4 Pa, that is, when the electrode material is mainly composed of β-W, due to difference in the condition of the surface of the film of W as shown in FIG. 8A to FIG. 11B, and so on. Therefore, when W is considered to be used as an electrode material, it is preferable to select α-W which has lower resistivity of electrode material and shows preferable voltage-current characteristics when applied to a current steering element, and with which a large current density that exceeds 10000 A/cm² (an example of the lowest current density $J_{min}$ (A/cm²) described above) can be obtained. Thus, α-W is one of the preferable materials for the electrode of the current steering element including a current steering layer of $SiN_x$.

In addition, when viewed from a thermodynamic standpoint, α-W is more stable than β-W, and β-W changes into α-W with volume change (contraction) at high temperature, and thus it can be considered that, when W is used as an electrode material, it is preferable to select α-W from the standpoint of reliability of the current steering element.

It is to be noted that, the sputtering method is applicable as the method of forming α-W as described above, however, the method is as not limited to this, and a so-called CVD method may be applied. In addition, when the sputtering method is applied as the method of forming α-W, sputtering is to be performed on the W target in Ar gas atmosphere in which the pressure is equal to or lower than 0.8 Pa, according to the result of a previous experiment.

Figure 14A:
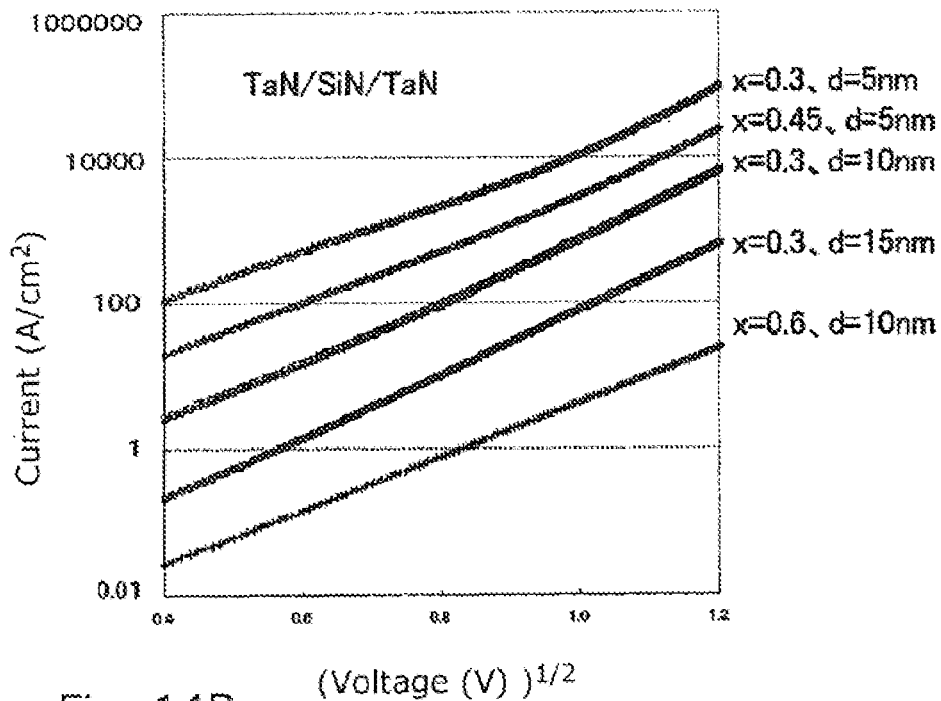
FIGS. 14A and 14B are characteristic diagrams which show results of measuring voltage-current characteristics of current steering elements including: current steering layers composed of $SiN_x$; and a pair of electrodes composed of TaN or W.
Figure 14B:
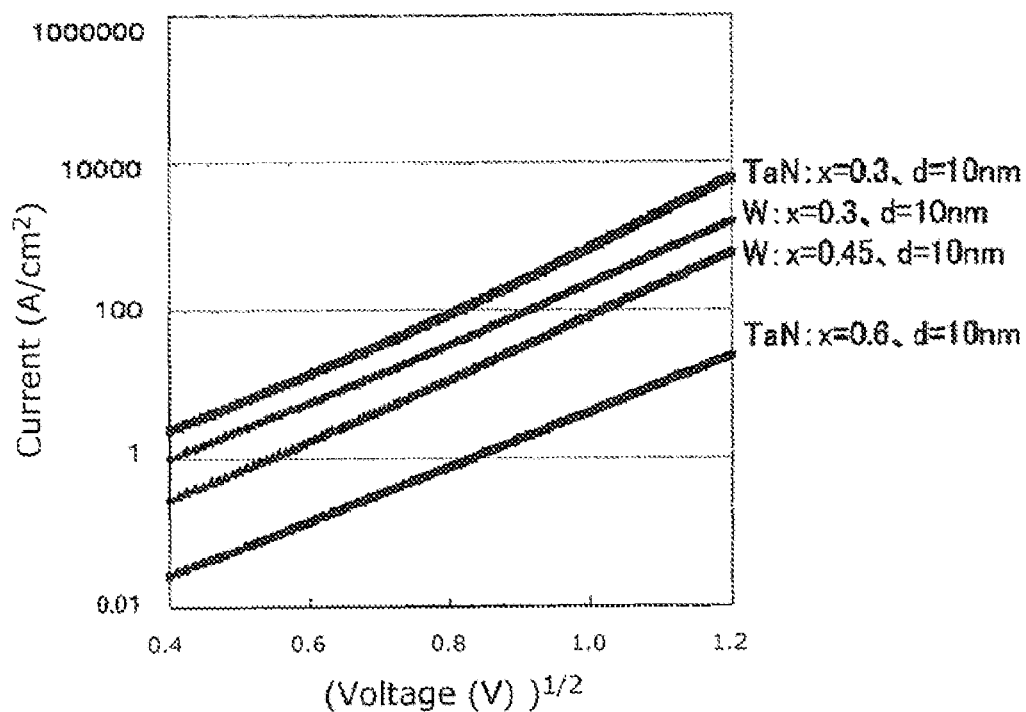

The following describes a relationship between the nitrogen composition ratio x of $SiN_x$ and the thickness of $SiN_x$ with respect to the characteristics of the current steering element. In the case of the current steering element (MSM diode) according to an aspect of the present invention, current (referred to as thermionic electron emission current, or schottky current) emitted to the current steering layer ($SiN_x$) from an electrode (TaN, W, and the like) may be considered as a electrical conduction mechanism. The schottky current depends on work function of the material included in the electrode; however, the potential barrier against an electron actually emitted from a metal is affected by Coulomb electrostatic attraction (referred to as image force, in some cases) that is attributed to the emitted electron having negative charge, and positive charge of the same charge amount left in the metal. A relationship that ln(J) is proportional to $(V)^{1/2}$ is derived by calculating the relationship between a voltage (hereinafter denoted as V) applied between both ends of the current steering element and current (hereinafter denoted as J) flowing through the current steering element, in view of the image force. For derivation of specific expression, see Non Patent Literature 1: edited by Mitsumasa Iwamoto, EE Text electrical and electronic material engineering, Ohm-sha, 2004. In fact, FIG. 14A and FIG. 14B show semi-logarithm graphs of voltage-current characteristics of a variety of MSM diodes each including an electrode material of TaN or W, in which the vertical axis is current flowing through the current steering element and the horizontal axis is a square root of a voltage applied to the both ends of the current steering element. FIG. 14A is data related to a sample including an electrode material of TaN and a current steering layer in which a nitrogen composition ratio x of SiNx and a thickness are changed. The nitrogen composition ratios X and the thicknesses d are respectively described in the right space of FIG. 14A. In addition, FIG. 14B is data related to a sample including an electrode material of TaN or W and a current steering layer in which a nitrogen composition ratio x of SiNx is changed. The electrode materials and the nitrogen composition ratios X are respectively described in the right space of FIG. 14B. All of the thicknesses d are set as 10 nm.

FIG. 14A and FIG. 14B shows straight lines each having substantially the same gradient, suggesting that the above-described relationship that ln(J) is proportional to $(V)^{1/2}$ is established irrespective of the electrode materials. Thus, the current J flowing through the current steering element can be represented in the form of Expression (5).

$$J = A \exp(\gamma (V)^{1/2}) \quad (5)$$

Here, γ is a constant number independent of the nitrogen composition ratio x of $SiN_x$ or the thickness of $SiN_x$ which is a current steering layer, and A is a constant number independent of the voltage V applied to the both ends of the current steering element.

Figure 15:
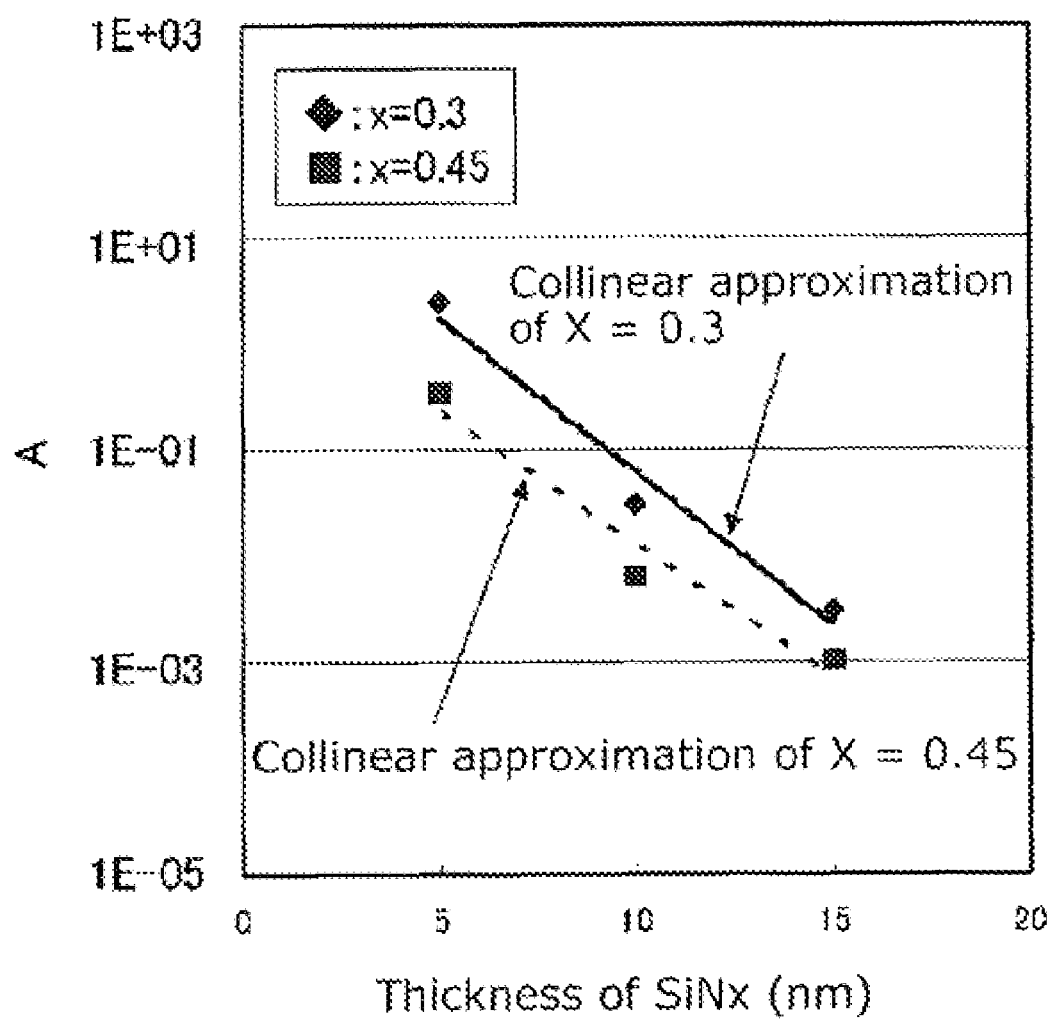
FIG. 15 is a characteristic diagram which shows a relationship between A of Expression (5) and the thickness d of a current steering layer including $SiN_x$.

Next, an advantageous effect of the thickness (hereinafter referred to as d) of the current steering layer will be considered. The schottky current depends on the height of a barrier (referred as a schottky barrier) at a junction generated between an electrode and a current steering layer. In general, the work function of the material included in the electrode, electron affinity of the current steering layer, an interface state that exists at the interface between the electrode and the current steering layer, and so on exercise a dominant influence over the height of the barrier, and thus the relationship between the thickness d of the current steering layer and the schottky current is not apparent. Here, it can be considered from Expression (5) that, since terms other than the right-hand constant number A in Expression (5) indicate V dependence property of the voltage-current characteristics of the MSM diode, the advantageous effect of the thickness d appears on the constant number A. Accordingly, in order to empirically obtain the relationship between the schottky current and the thickness d of the current steering layer, FIG. 15 shows a relationship between the thickness d and the constant number A, by calculating the constant number A and a constant number γ using the least-square method, by assuming it is possible to approximate, using Expression (5), voltage-current characteristics of a current steering element, in which the thickness of $SiN_x$ that is a current steering layer is changed to 5 nm, 10 nm, and 15 nm and the nitrogen composition ratio x is either one of two kinds, that is, 0.3 or 0.45. FIG. 15 shows that ln(A) is proportional to the thickness d and the gradient of the straight lines shown in FIG. 15 is substantially the same even when the nitrogen composition ratio x of $SiN_x$ that is the current steering layer is changed, and thus Expression (5) that represents current J flowing through the current steering element can be rewritten as in Expression (6) as shown below.

$$J = B \exp(\alpha d) \exp(\gamma (V)^{1/2}) \quad (6)$$

Here, α is a constant number independent of the nitrogen composition ratio x of $SiN_x$ or the thickness d of $SiN_x$ which is a current steering layer, and B is a constant number independent of the voltage V applied to the both ends of the current steering element or the thickness d of $SiN_x$.

Now, $SiN_x$ is used for the current steering layer according to an aspect of the present invention, and the band gap is continuously changed by changing the nitrogen composition ratio x of $SiN_x$, so that it is possible to control the dimensions of the potential barrier. As to the property of dependence on the nitrogen composition ratio x of a potential barrier attributed to $SiN_x$, since an optical bandgap of $SiN_x$ is substantially proportional to the nitrogen composition ratio x (see, for example, Non Patent Literature 2: R. Karcher et al, Physical Review B, vol. 30, page 1896-1910, 1984), the potential barrier attributed to $SiN_x$ is considered to be also substantially proportional to the nitrogen composition ratio x, and thus current that flows is considered to be substantially proportional to an exponent function of x.

As a result of the above-described consideration, it is found that current J that flows through the current steering element can be represented as Expression (7).

$$J = C \exp(\alpha d) \exp(\beta x) \exp(\gamma (V)^{1/2}) \quad (7)$$

where C, α, β, and γ are constant numbers.

When the constant numbers C, α, β, and γ in Expression (7) are calculated, using actual measured values of the voltage-current characteristics of the current steering element shown in FIG. 14A and FIG. 14B, by the least-square method, the following are obtained: $C=7.46\times10^{-2}$, $\alpha=-6.25\times10^{-1}$, $\beta=-11.7$, $\gamma=9.76$, and it is possible to calculated the voltage-current characteristics of the current steering element using the obtained values. It is to be noted that, in Expression (7), a unit of thickness d is nanometer (nm), a unit of V is volt (V), and a unit of J is $A/cm^2$.

Figure 16:
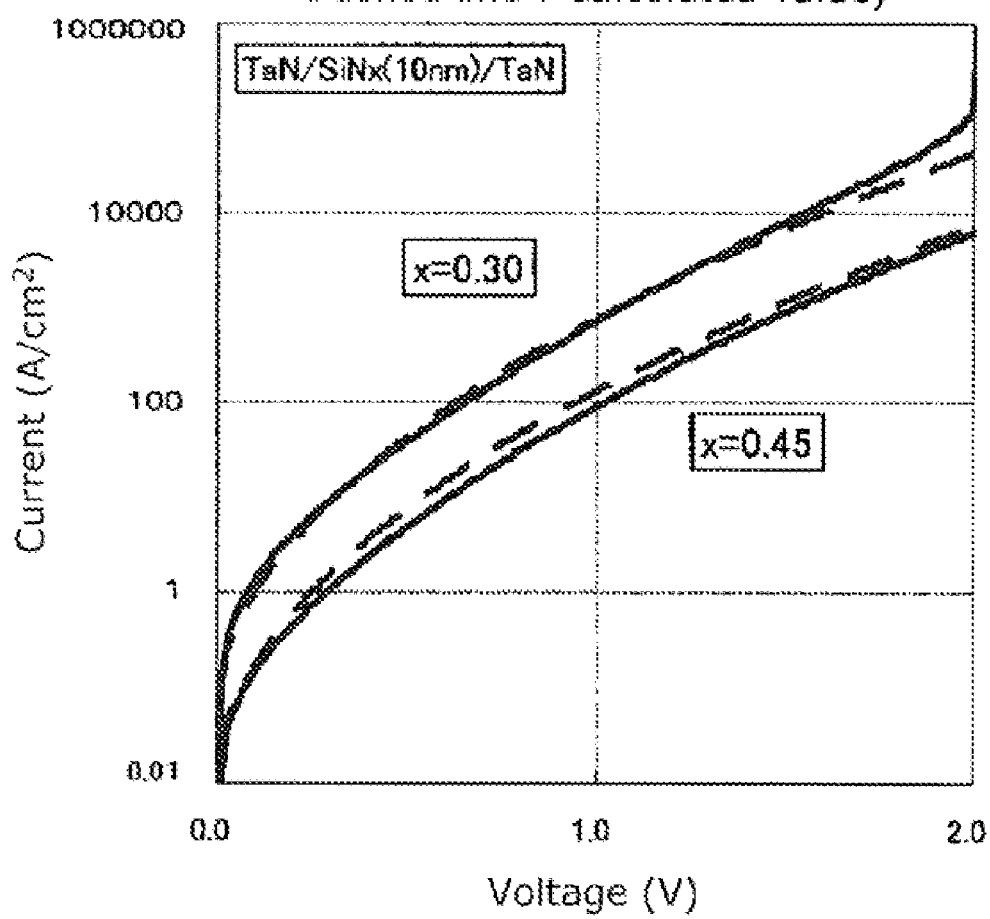
FIG. 16 is a characteristic diagram which shows measured values of voltage-current characteristics of current steering elements including: current steering layers composed of SiN$_x$; and a pair of electrodes composed of TaN or W and a calculated value obtained by Expression (7).

FIG. 16 illustrates some of the measured values of the voltage-current characteristics of the current steering element shown in FIGS. 14A and (b), together with values calculated by Expression (7). It is to be noted that the horizontal axis in FIG. 16 indicates not a square root of a voltage but a voltage. Preferable consistency can be seen in the diagram, and thus it can be considered that Expression (7) represents the voltage-current characteristics of the current steering element.

As already described above, the current steering element in which $SiN_x$ is used as the current steering layer has voltage-current characteristics that depend on the nitrogen composition ratio x and the thickness of the current steering layer, and it is possible to obtain desired (more preferable) characteristics by appropriately selecting the nitrogen composition ratio x and the thickness of the current steering layer. When considering the perspective of the characteristic necessary for writing data into the variable resistance element, it is more preferable that current having a current density of equal or higher than 10000 $A/cm^2$ (an example of the lowest current density $J_{min}$ ($A/cm^2$) described above) can be caused to flow at the time of writing of data. When the maximum value of a voltage that can be applied between the both ends of the variable resistance element is $V_0$ volt, the relationship between the nitrogen composition ratio x and the thickness d is represented as follows, according to Expression (7).

$$(\ln(10000(C\exp(\alpha d)\exp(\beta x))^{-1})/\gamma)^2 \leq V_0 \quad (8)$$

$$(\ln(30000(C\exp(\alpha d)\exp(\beta x))^{-1})/\gamma)^2 \leq V_0 \quad (9)$$

$$(\ln(50000(C\exp(\alpha d)\exp(\beta x))^{-1})/\gamma)^2 \leq V_0 \quad (10)$$

Expression (8) is a relational expression in the case where the current density of current flowing through the current steering element is 10000 $A/cm^2$. Here, the left-hand side of the above Expression (8) is a value obtained by solving the above Expression (7) for the voltage V, that is, the voltage to be applied to the both ends of the current steering element in order to set the current density $J_{min}$ of current flowing through the current steering element at 10000 $A/cm^2$. Thus, the inequality expression of the above Expression (8) represents a condition that causes a voltage to be applied to the both ends of the current steering element in order to set the current density $J_{min}$ of current flowing through the current steering element at 10000 $A/cm^2$ to be equal to or lower than the maximum value $V_0$, in other words, a condition that ensures that current having the current density $J_{min}$ ($A/cm^2$) of 10000 $A/cm^2$ flows through the current steering element even when the voltage that can be applied between the both ends of the current steering element is equal to or lower than the maximum value $V_0$ (the relationship to be satisfied by the thickness d and the nitrogen composition ratio x).

Expression (9) is a relational expression in the case where the current density of current flowing through the current steering element is 30000 $A/cm^2$. This relational expression corresponds to the condition described in PTL 2. More specifically, Expression (9) represents a condition that ensures that current having the current density $J_{min}$ ($A/cm^2$) of 30000 $A/cm^2$ flows through the current steering element even when the voltage applied to the both ends of the current steering element is equal to or lower than the maximum value $V_0$ (the relationship to be satisfied by the thickness d and the nitrogen composition ratio x).

Expression (10) is a relational expression in the case where the current density of current flowing through the current steering element is 50000 $A/cm^2$. More specifically, Expression (10) represents a condition that ensures that current having the current density $J_{min}$ ($A/cm^2$) of 50000 $A/cm^2$ flows through the current steering element even when the voltage applied to the both ends of the current steering element is equal to or lower than the maximum value $V_0$ (the relationship to be satisfied by the thickness d and the nitrogen composition ratio x).

Figure 17:
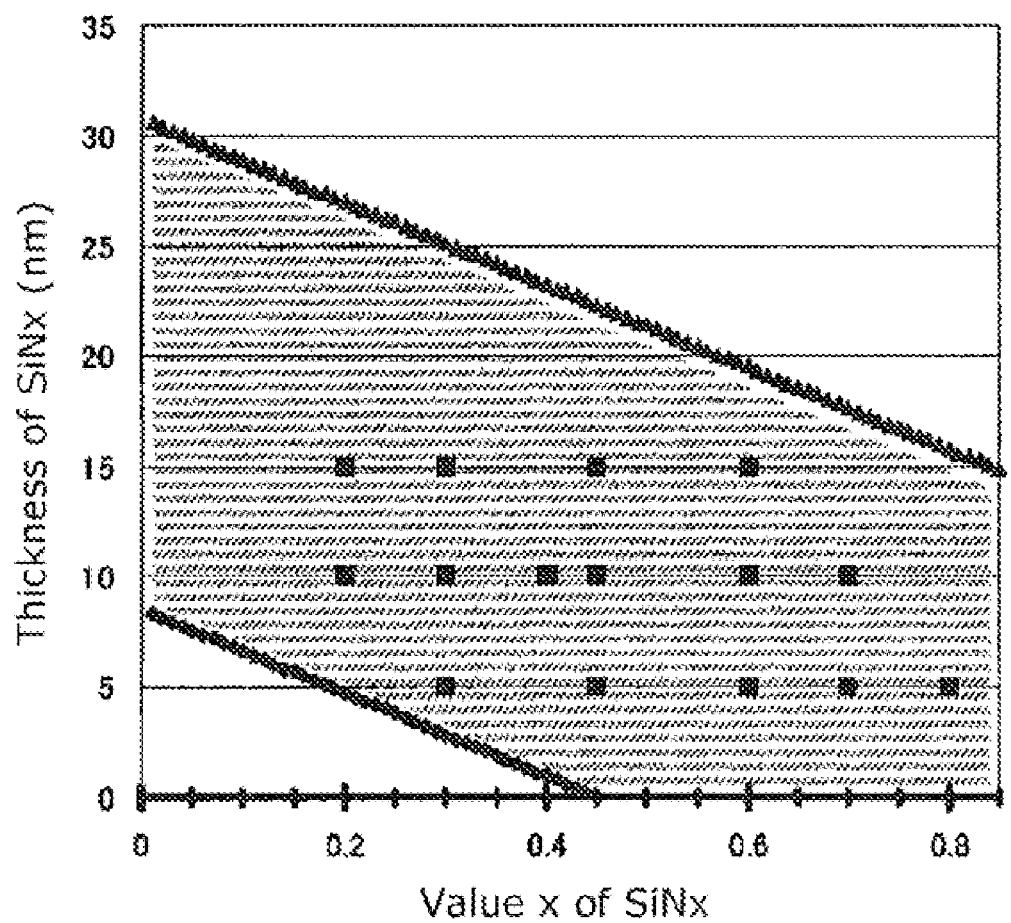
FIG. 17 is a characteristic diagram which shows a combination of a thickness d and a nitrogen composition ratio x, which concurrently satisfies Expressions (8) and (11).
Figure 18:
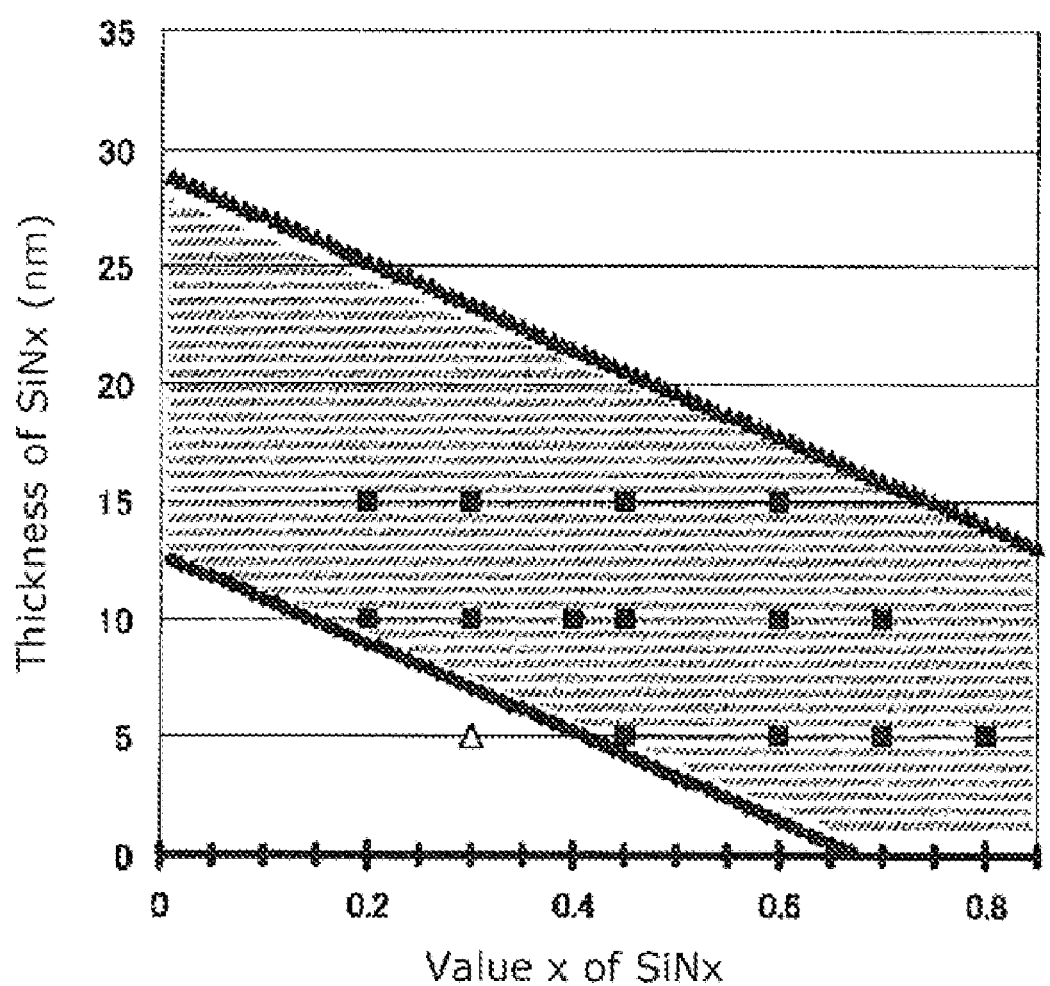
FIG. 18 is a characteristic diagram which shows a combination of a thickness d and a nitrogen composition ratio x, which concurrently satisfies Expressions (9) and (12).
Figure 19:
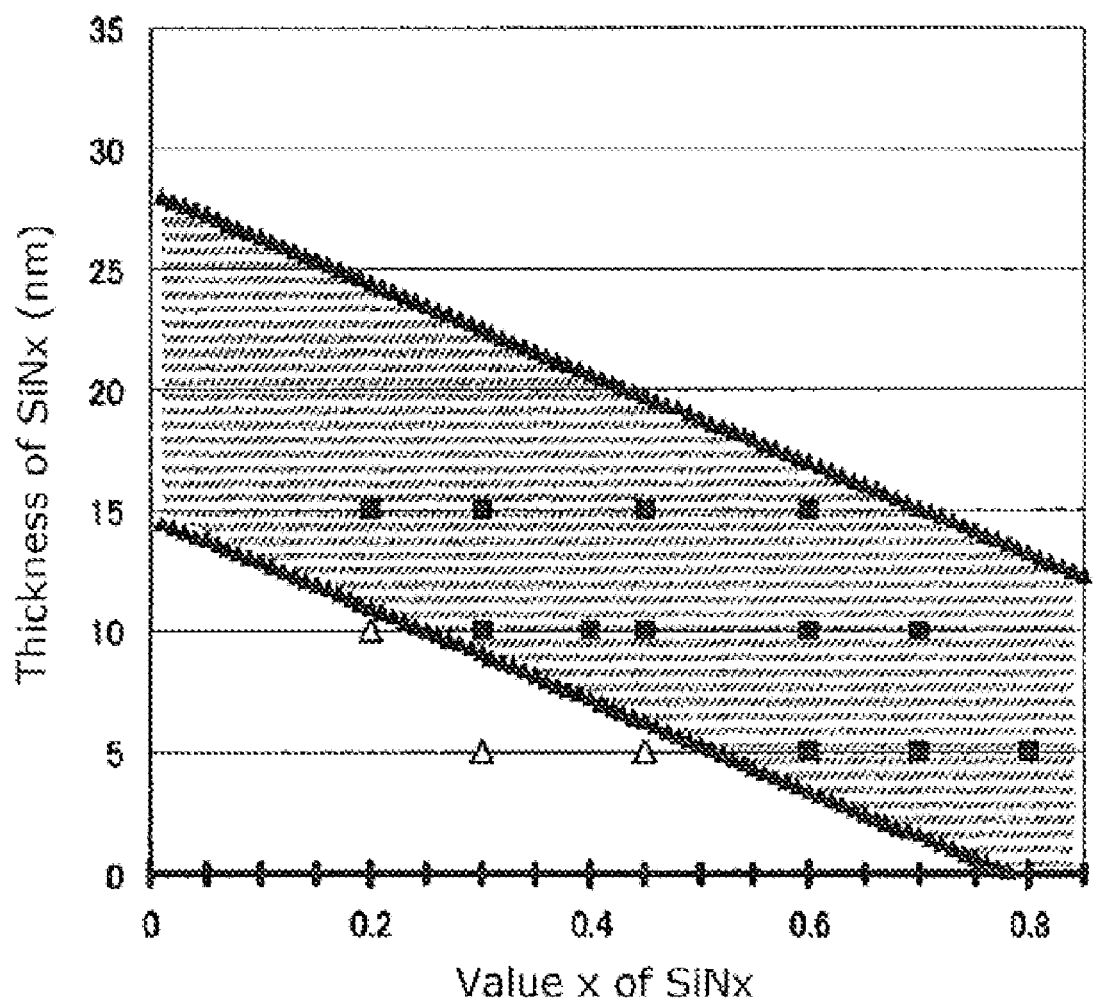
FIG. 19 is a characteristic diagram which shows a combination of a thickness d and a nitrogen composition ratio x, which concurrently satisfies Expressions (10) and (13).

FIG. 17, FIG. 18, and FIG. 19 show plots of Expression (8), Expression (9), and Expression (10), respectively, in the case of $V_0=5$ V. The upper limit line of $SiN_x$ in the thickness direction of each of the diagrams is a line that corresponds to the case where equality is satisfied in each of the expressions.

The condition changes such that the current density flowing through the current steering element becomes larger as the expression shifts from Expression (6) to Expression (7) or from Expression (7) to Expression (8). The condition changes to be more preferable with allowance in terms of obtaining further flexibility in a circuit design of the storage device. However, the condition changes to be more restrictive in terms of design flexibility of a manufacturing process of the storage device. In any case, it is necessary to set the appropriate nitrogen composition ratio x and the thickness d according to the characteristics, operational condition, and so on, of the variable resistance element to be used.

In addition, in terms of non linearity of electric resistance characteristics of the current steering element, with a voltage equal to or lower than a voltage applied to an element other than a selected element at the time of data writing and data reading, the current steering element is in a shut off state that is a state in which current flowing through the current steering element is significantly small. The maximum value of a voltage that can be applied to the element other than the selected element is half a voltage that applied to the selected element at the time of data writing, and thus the current steering element is in the shut off state when the voltage applied to the element other than the selected element is applied. In the shut off state, it is desirable that current flowing through the current steering element is small, or that there is a large difference between the current flowing in the shut off state and the current flowing when the current steering element is in a conductive state. Furthermore, it is necessary that current flowing through the current steering element in the shut off state is at least the same or smaller than current flowing through when the variable resistance element is in a high resistance state, in order to determine a high resistance state or a low resistance state at the time of data reading.

Here, FIG. 1 shows that the current, which flows when the variable resistance element is in the high resistance state, appears from 0 V to approximately −0.8 V in a curve indicated by the arrow 1 and from 0 V to approximately +0.5 V in a curve indicated by the arrow 4, and the current, which flows when the variable resistance element is in the low resistance state, appears from 0 V to approximately +0.9 V in a curve indicated by the arrow 3 and from −6 V to approximately 0 V in a curve indicated by the arrow 2. Accordingly, when the difference between the current flowing in the high resistance state and the current flowing in the low resistance state is viewed at the point where the voltage is ±0.5 V, it is found that the current flowing in the high resistance state is approximately one-quarter to one-fifth of the current flowing in the low resistance state. Since the voltage-current characteristics in the range of −0.5 V to +0.5 V of the voltage are considered to be approximately linear in both of the high resistance state and the low resistance state, the difference is observed at the point where the voltage is ±0.5 V. Therefore, it is necessary that the current flowing through the current steering element in the shut off state is approximately at lest one-quarter to one-fifth compared to the current flowing through when the variable resistance element is in the low resistance state, and when taking into consideration the variation of elements and the like, one-tenth or smaller is desirable, one-thirtieth or smaller is more desirable, and one-fiftieth or smaller is yet more desirable.

In view of the above, it is required that current flowing through the current steering element when a voltage applied to an element other than a selected element at the time of data writing (that is, half a voltage applied to the selected element at the time of data writing, and the current steering element is in the shut off state at this time) is applied to the current steering element is smaller by equal to or more than one digit than the current flowing through the current steering element when the voltage applied to the selected element at the time of data writing is applied, the current being a current flowing at the time of data writing and larger than a current flowing through the storage element when the variable resistance element is in the low resistance state. Accordingly, the allowable maximum current density $J_{off}$ (A/cm$^2$) of current flowing through the current steering element when the current steering element is in the shut off state is one-tenth of the smallest current density $J_{min}$ (A/cm$^2$) of current to be caused to flow through the current steering element, preferably one-thirtieth, and further preferably one-fiftieth.

This is represented in a relationship between the nitrogen composition ratio x and the thickness d using Expression (7) as follows:

$$(\ln(1000(C\exp(\alpha d)\exp(\beta x))^{-1})/\gamma)^2 - (\ln(10000(C\exp(\alpha d)\exp(\beta x))^{-1})/\gamma)^2/2 \geq 0 \quad (11)$$

$$(\ln(1000(C\exp(\alpha d)\exp(\beta x))^{-1})/\gamma)^2 - (\ln(30000(C\exp(\alpha d)\exp(\beta x))^{-1})/\gamma)^2/2 \geq 0 \quad (12)$$

$$(\ln(1000(C\exp(\alpha d)\exp(\beta x))^{-1})/\gamma)^2 - (\ln(50000(C\exp(\alpha d)\exp(\beta x))^{-1})/\gamma)^2/2 \geq 0 \quad (13)$$

Expression (11) shows that a voltage applied to an unselected element, that is, a voltage of half a voltage applied to a selected element at the time of data writing, is equal to or lower than a voltage applied to the both ends of a current steering element in which current flowing therethrough has a current density of 1000 A/cm$^2$. This current density is lower by one digit than a current density (10000 A/cm$^2$) of current flowing through the current steering element when a voltage applied to the selected element at the time of data writing is provided, and the current steering element is in the shut off state at this time. More specifically, Expression (11) shows the condition (the relationship to be satisfied between the thickness d and the nitrogen composition ratio x) that ensures that the current density $J_{off}$ (A/cm$^2$) of current flowing through the current steering element in the unselected state is one-tenth of the current density $J_{min}$ (A/cm$^2$) of current flowing through the current steering element in the selected state.

Expression (12) is a relational expression in the case where the current density of current flowing through the current steering element is 30000 A/cm$^2$ (that is, the case where 30000 A/cm$^2$ is required for changing resistance of the variable resistance element) and where the current density of current, which flows through the current steering element when half a voltage applied to the select element at the time of data writing is provided, is equal to or lower than 1000 A/cm$^2$. More specifically, Expression (12) shows the condition (the relationship to be satisfied between the thickness d and the nitrogen composition ratio x) that ensures that the current density $J_{off}$ (A/cm$^2$) of current flowing through the current steering element in the unselected state is equal to or lower than one-thirtieth of the current density $J_{min}$ (A/cm$^2$) of current flowing through the current steering element in the selected state.

Expression (13) is a relational expression in the case where the current density of current flowing through the current steering element is 50000 A/cm$^2$ and where the current density of current, which flows through the current steering element when half a voltage applied to the select element at the time of data writing is provided, is equal to or lower than 1000 A/cm$^2$. More specifically, Expression (13) shows the condition (the relationship to be satisfied between the thickness d and the nitrogen composition ratio x) that ensures that the current density $J_{off}$ (A/cm$^2$) of current flowing through the current steering element in the unselected state is equal to or lower than one-fiftieth of the current density $J_{min}$ (A/cm$^2$) of current flowing through the current steering element in the selected state.

FIG. 17, FIG. 18, and FIG. 19 show plots of Expression (11), Expression (12), and Expression (13), respectively. The lower limit line of SiN$_x$ in the thickness direction of each of the diagrams is a line that corresponds to the case where equality is satisfied in each of the expressions.

The condition changes such that the current density flowing through the current steering element becomes larger and the difference between the current flowing through the current steering element in the shut off state and the current flowing through when the current steering element is in the conductive state becomes larger, as the expression shifts from Expression (11) to Expression (12) or from Expression (12) to Expression (13). The condition changes to be more preferable with allowance in terms of obtaining further flexibility in a circuit design of the storage device. However, the condition changes to be more restrictive in terms of design flexibility of a manufacturing process of the storage device. In any case, it is necessary to set the appropriate nitrogen composition ratio x and the thickness d according to the characteristics, operational condition, and so on, of the variable resistance element to be used.

FIG. 17 shows a range of a combination of the thickness d and the nitrogen composition ratio x that satisfies Expression (8) and Expression (11). In the diagram, dots in the region surrounded by two diagonal lines (illustrated by diagonal dashed lines) satisfy Expression (8) and Expression (11). It is to be noted that, in FIG. 17, calculation is carried out by setting the voltage (V$_0$) applied to the current steering element at 5V. The range of SiN$_x$ is 0<x≦0.85, and the thickness d of SiN$_x$ is 0<d. Here, the current steering element is actually manufactured by way of trial and evaluated, and the combination of the thickness d and the nitrogen composition ratio x which is empirically confirmed to satisfy Expression (8) and Expression (11) is indicated by a black square in the diagram.

In addition, FIG. 18 shows a range of a combination of the thickness d and the nitrogen composition ratio x that satisfies Expression (9) and Expression (12). In the diagram, dots in the region surrounded by two diagonal lines (illustrated by diagonal dashed lines) satisfy Expression (9), Expression (12), 0<x≦0.85, and 0<d. It is to be noted that, in FIG. 18, calculation is carried our by setting the voltage (V$_0$) applied to the current steering element at 5V. Here, the current steering element is actually manufactured by way of trial and evaluated, and the combination of the thickness d and the nitrogen composition ratio x which is empirically confirmed to satisfy Expression (9) and Expression (12) is indicated by a black square in the diagram, whereas the combination of the thickness d and the nitrogen composition ratio x which is confirmed, by evaluation of the current steering element actually manufactured by way of trial, that Expression (9) and Expression (12) are not satisfied at the same time, is indicated by a white triangle in the same diagram.

In the same manner, FIG. 19 shows a range of a combination of the thickness d and the nitrogen composition ratio x that satisfies Expression (10) and Expression (13). In the diagram, dots in the region surrounded by two diagonal lines (illustrated by diagonal dashed lines) satisfy Expression (10), Expression (13), $0 < x \leq 0.85$, and $0 < d$. It is to be noted that, in FIG. 19, calculation is carried our by setting the voltage ($V_0$) applied to the current steering element at 5 V. Here, the current steering element is actually manufactured by way of trial and evaluated, and the combination of the thickness d and the nitrogen composition ratio x which is empirically confirmed to satisfy Expression (10) and Expression (13) is indicated by a black square in the diagram, whereas the combination of the thickness d and the nitrogen composition ratio x which is confirmed, by evaluation of the current steering element actually manufactured by way of trial, that Expression (10) and Expression (13) are not satisfied at the same time, is indicated by a white triangle in the same diagram.

FIG. 18 and FIG. 19 show a range of a combination of the thickness d and the nitrogen composition ratio x that is preferable for the current steering element, using Expression (9) and Expression (12) or Expression (10) and Expression (13) which are created based on Expression (7). Consistency can be seen with the result of evaluation of several kinds of current steering elements actually manufactured by way of trial, which is considered to be suggesting validity of Expression (7), and Expression (8) to Expression (13) which are created based on Expression (7).

Figure 20:
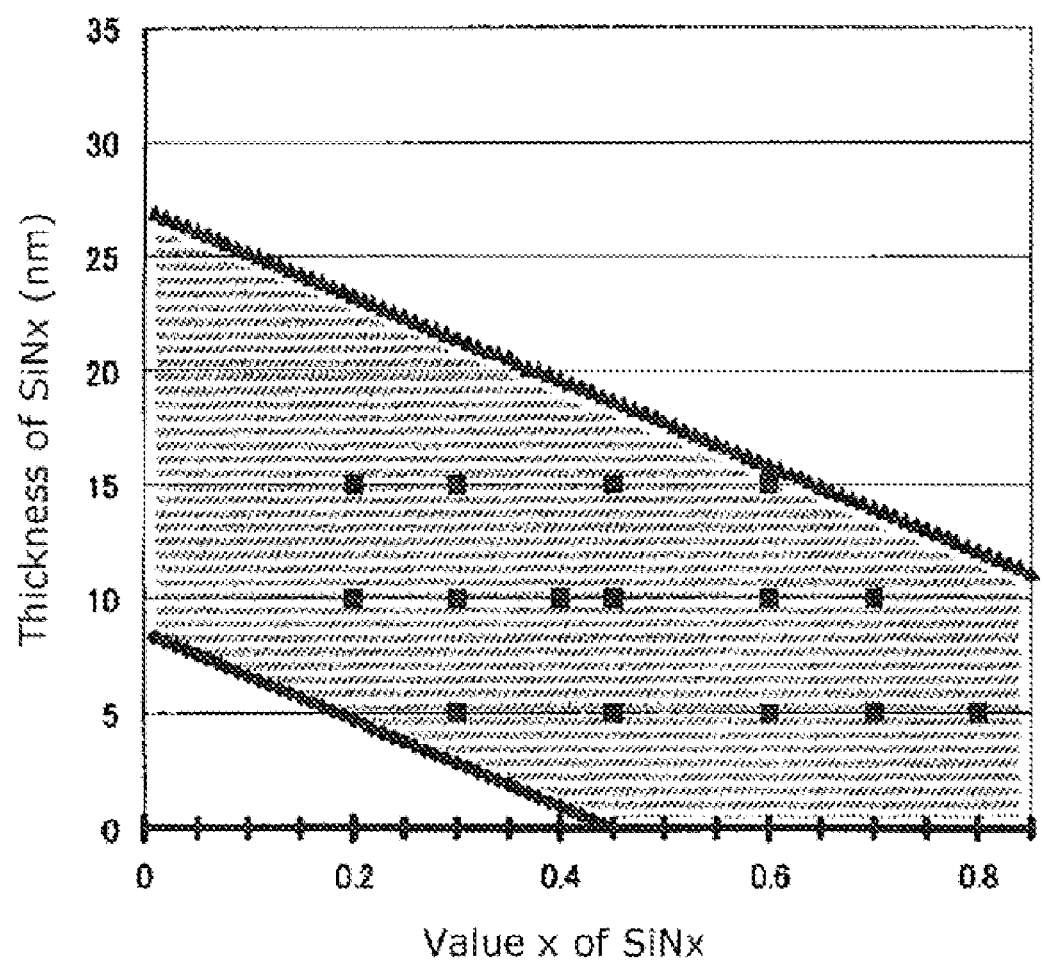
FIG. 20 is a characteristic diagram which shows a combination of a thickness d and a nitrogen composition ratio x, which concurrently satisfies Expressions (8) and (11).

FIG. 20 shows a range of a combination of the thickness d and the nitrogen composition ratio x that satisfies Expression (8) and Expression (11) when a voltage ($V_0$) applied to the current steering element is set at 4 V. In the diagram, dots in the region surrounded by two diagonal lines (illustrated by diagonal dashed lines) satisfy Expression (8) and Expression (11). Here, the current steering element is actually manufactured by way of trial and evaluated, and the combination of the thickness d and the nitrogen composition ratio x which is confirmed to satisfy Expression (8) and Expression (11) is indicated by a black square in the diagram.

Figure 21:
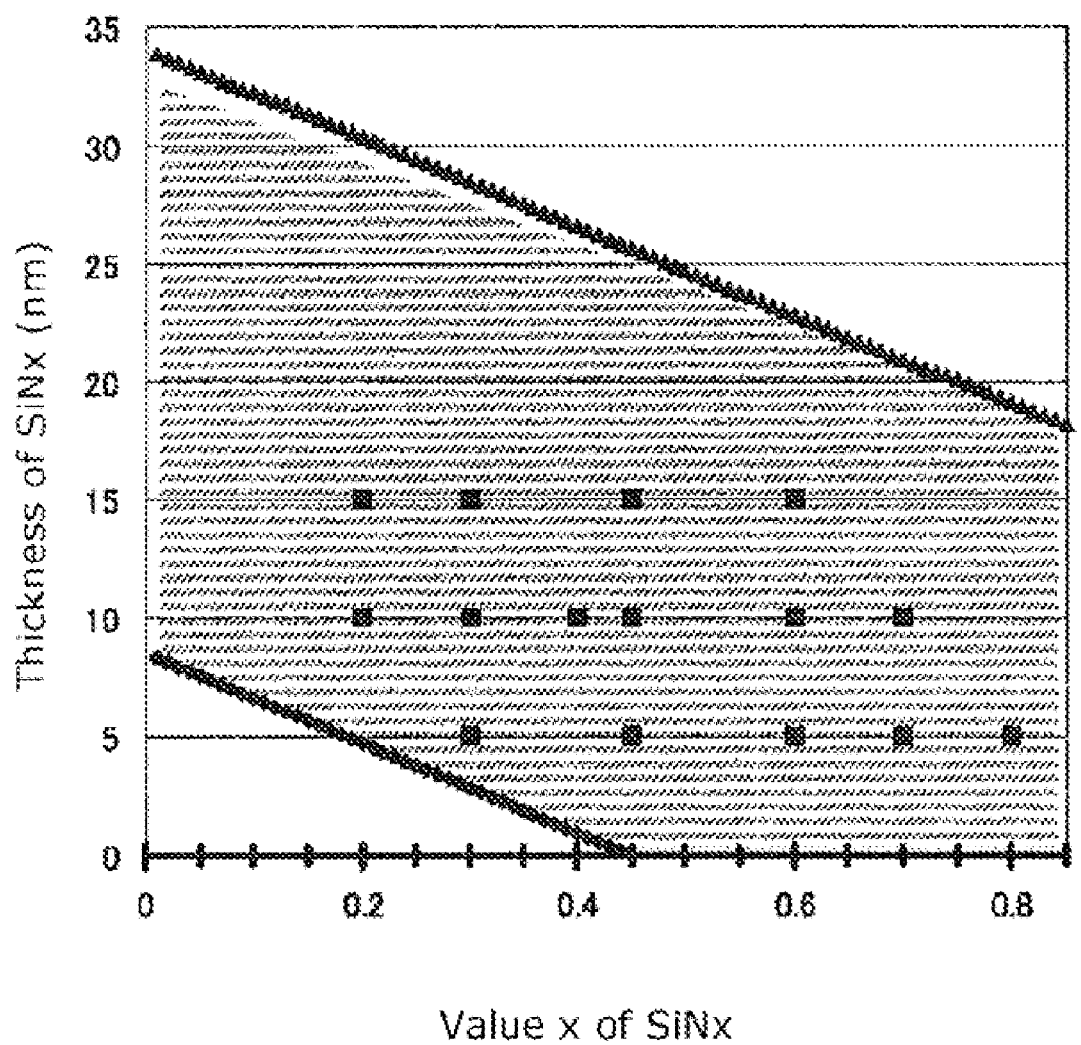
FIG. 21 is a characteristic diagram which shows a combination of a thickness d and a nitrogen composition ratio x, which concurrently satisfies Expressions (8) and (11).

In addition, FIG. 21 shows a range of a combination of the thickness d and the nitrogen composition ratio x that satisfies Expression (8) and Expression (11) when a voltage ($V_0$) applied to the current steering element is set at 6V. In the diagram, dots in the region surrounded by two diagonal lines (illustrated by diagonal dashed lines) satisfy Expression (8) and Expression (11). Here, the current steering element is actually manufactured by way of trial and evaluated, and the combination of the thickness d and the nitrogen composition ratio x which is confirmed to satisfy Expression (8) and Expression (11) is indicated by a black square in the diagram.

It is possible to provide a current steering element, a storage element, and a storage device each of which is capable of: preventing occurrence of write disturb even when electric pulses having different polarities are applied; causing large current to flow through the variable resistance element; and writing data without problem, by applying, to the current steering layer, the combination of the thickness d and the nitrogen composition ratio x shown in FIG. 17 to FIG. 21 described above, and by configuring: the current steering element in which the applied current steering layer is included; the storage element in which the current steering element and the variable resistance element are included; and the storage device in which the storage element is included.

In addition, it is possible to sufficiently prevent occurrence of leak current flowing into the current steering element attributed to a tunneling effect, by adding restriction of the thickness d being 5 nm or larger to the combination of the thickness d and the nitrogen composition ratio x shown in FIG. 17 to FIG. 21, making it possible to provide the storage element and the storage device in which the characteristics of the current steering element are stabled.

Figure 22A:
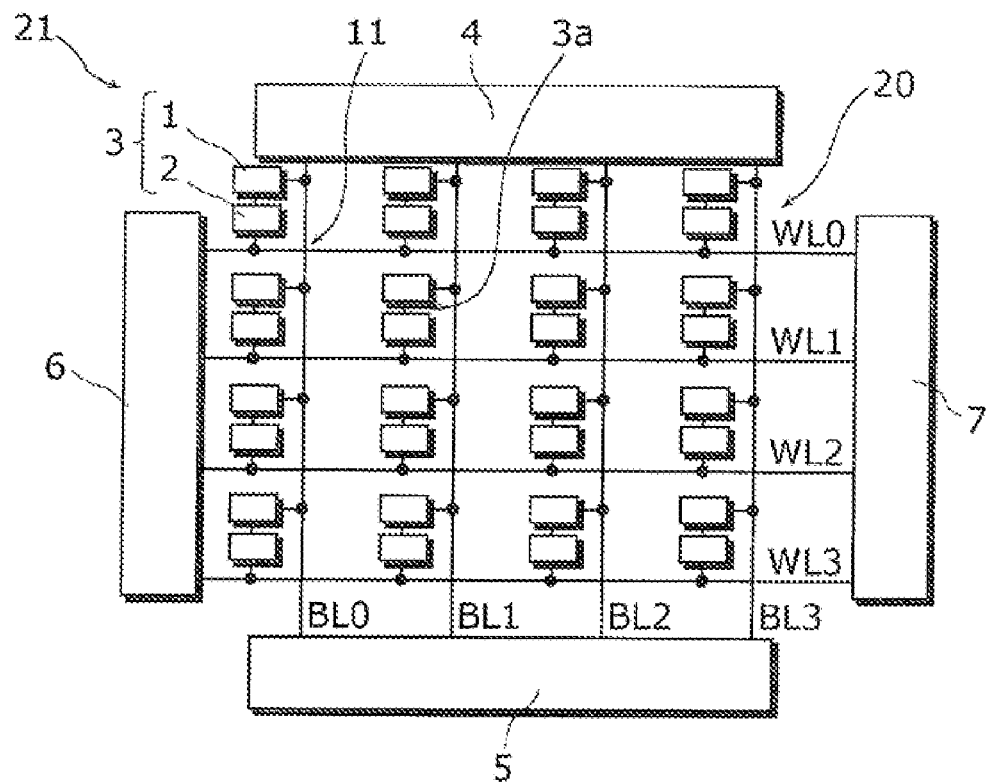
FIG. 22A is a block diagram which schematically shows a configuration of a storage device including a current steering element according to an embodiment of the present invention.

FIG. 22A is a block diagram which schematically shows a configuration of a storage device including a storage element according to an embodiment of the present invention. It is to be noted that, in FIG. 22A, only the structural elements necessary for explaining the present invention are illustrated, and illustration of other structural elements are omitted.

As shown in FIG. 22A, a storage device 21 according to the present embodiment is a so-called cross point storage device. The storage device 21 includes: a storage element array 20; and a peripheral circuit for driving the storage element array 20, such as a bit line decoder 4, a read circuit 5, and word line decoders 6 and 7.

It is to be noted that an actual storage element array generally includes plural bit lines and plural word lines; however, the storage element array 20 exemplified in the present Description as shown in FIG. 22A includes four bit lines BL0 to BL3 and four word lines WL0 to WL3 so that the configuration of the storage element array can easily be understood.

Figure 22B:
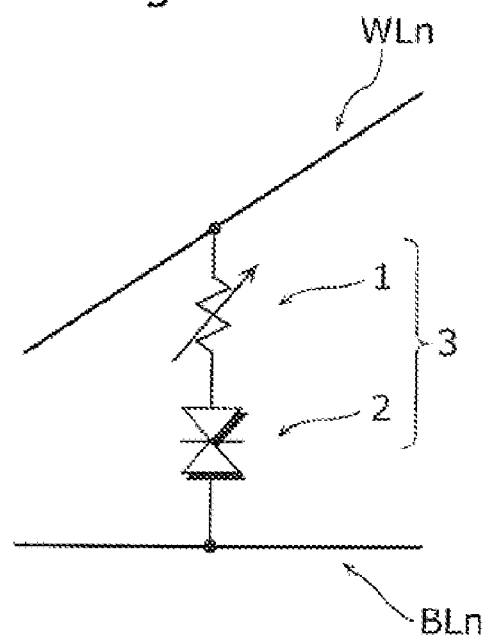
FIG. 22B is an equivalent circuit of a storage element included in the storage device.

In the storage element array 20 according to the present embodiment, is four bit lines BL0 to BL3 and four word lines WL0 to WL3 are provided so as to three-dimensionally crosses with each other. Furthermore, a storage element 3 (a so-called memory cell) is provided in a corresponding one of three-dimensional cross points 11 of the four bit lines BL0 to BL3 and the four word lines WL0 to WL3. In other words, in the storage element array 20 according to the present embodiment, the storage elements 3 are arranged in a matrix of four lines and four columns. Here, each of the storage elements 3 is composed of a series circuit that includes a variable resistance element 1 and a current steering element 2 connected in series to the variable resistance element 1, as shown by an analogous circuit in FIG. 22B. Furthermore, the series circuit includes one end and the other end, each of which is connected to one of a bit line BLn (a corresponding one of the BL0 to BL3) and a word line WLn (a corresponding one of the WL0 to WL3) which correspond to the three-dimensional crosspoint 11 in which the series circuit is provided.

As shown in FIG. 22A, one end of each of the four bit lines BL0 to BL3 is connected to the bit line decoder 4. In addition, the other end of each of the bit lines BL0 to BL3 is connected to the read circuit 5. On the other hand, each of the four word lines WL0 to WL3 has one end connected to the word line decoder 6 and the other end connected to the word line decoder 7.

In the storage device 21, the bit line decoder 4 selects at least one out of the bit lines BL0 to BL3, according to an instruction from a controller (not illustrated). In addition, each of the word line decoders 6 and 7 selects at least one out of the word lines WL0 to WL3, according to an instruction from the controller. Then, with the bit line decoder 4 and the word line decoders 6 and 7, depending on whether the instruction from the controller is to write data (hereinafter simply referred to as "writing") or to read data (hereinafter simply referred to as "reading"), electric pulses (voltage pulses, to be exact) of which a voltage is a predetermined write voltage Vw or electric pulses (voltage pulses, to be exact) of which a voltage is a predetermined read voltage Vr is applied between a bit line selected out of bit lines BL0 to BL3 and a word line selected out of word lines WL0 to WL3. On the other hand, at the time of reading, the read circuit 5 detects a current value flowing through the bit line selected out of bit lines BL0 to BL3, reads data stored in the storage element 3, and outputs the read data to the controller. Here, the peripheral circuit such as the bit line decoder 4, the read circuit 5, and the word line decoders 6 and 7 includes MOSFET, for example. In addition, the storage device 21 is generally manufactured through a manufacturing process for semiconductors.

It is to be noted that, in the present embodiment, each of the first electrode 32 and the second electrode 31 which is included in the current steering element 2 (see FIG. 2) is connected to a corresponding one of one electrode (not illustrated) of the variable resistance element 1 and one of word lines WL0 to WL3. On the other hand, the other electrode (not illustrated) of the variable resistance element 1 is connected to a corresponding one of the bit lines BL0 to BL3. However, the configuration is not limited to such a form, and may be the one in which the first electrode 32 (or the second electrode 31) of the current steering element 2 doubles as one of the electrodes of the variable resistance element 1, for example.

The following describes in detail a specific operation of the storage device according to the present embodiment, with reference to the diagrams.

Figure 23:
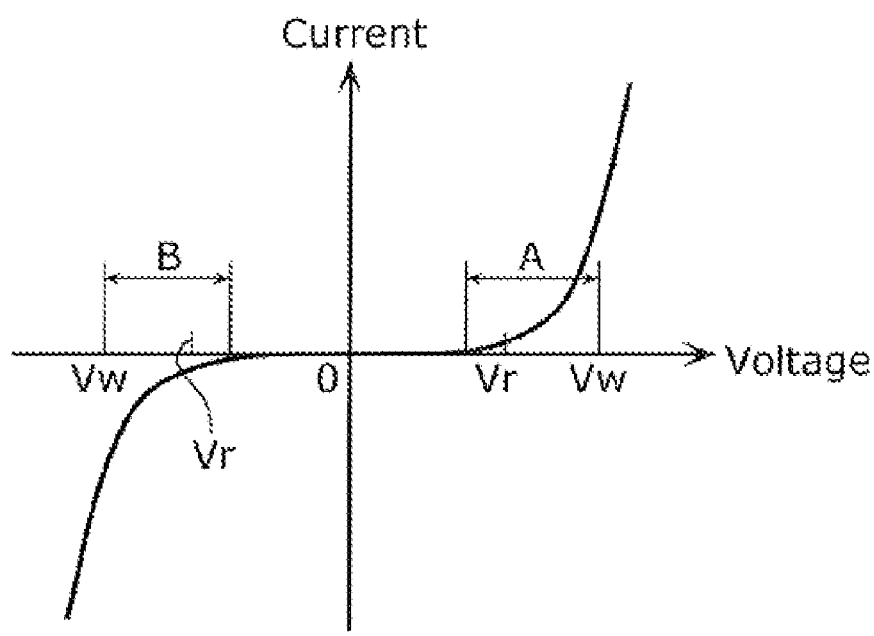
FIG. 23 is a characteristic diagram which schematically shows voltage-current characteristics of a current steering element according to an embodiment of the present invention.

FIG. 23 is a characteristic diagram which schematically shows voltage-current characteristics of a current steering element according to an embodiment of the present invention. It is to be noted that, in FIG. 23, Vw indicates a write voltage and Vr indicates a read voltage.

As to the voltage-current characteristics of the current steering element 2 shown in FIG. 23, the write voltage Vw is set at a voltage whose absolute value is equal to or larger than an absolute value of a critical voltage (the lower limit voltage in the range A and the upper limit voltage in the range B) and which is sufficient to shift the state of the variable resistance element 1 between the low resistance state and the high resistance state and has an absolute value that does not break the variable resistance element 1. According to the present embodiment, the write voltage Vw is set at the upper limit voltage of the range A and the lower limit voltage of the range B. Here, the state of the variable resistance element 1 changes from the low resistance state to the high resistance state when positive electric pulses are applied, and changes from the high resistance state to the low resistance state when negative electric pulses are applied, for example.

On the other hand, as to the voltage-current characteristics of the current steering element 2 shown in FIG. 23, the read voltage Vr is set at a voltage whose absolute value is equal to or larger than an absolute value of a critical voltage and which has an absolute value that does not change the state of the variable resistance element 1 between the low resistance state and the high resistance state. More specifically, the read voltage Vr is set at a predetermined voltage included in the range A and the range B shown in FIG. 23.

Now, an operation of the storage device 21 shown in FIG. 22A is controlled by a controller which is not illustrated. More specifically, when a write instruction is provided to the storage device 21 from the controller, the bit line decoder 4 selects one of the bit lines BL0 to BL3, which has an address specified by the write instruction. On the other hand, the word line decoders 6 and 7 select one of the word lines WL0 to WL3, which has an address specified by the write instruction. With this, the storage element 3 in which data is to be written is selected. Then, the bit line decoder 4 and the word line decoders 6 and 7 cooperates with each other to apply, between the selected one of the bit lines BL0 to BL3 and the selected one of the word lines WL0 to WL3, electric pulses having the write voltage Vw corresponding to data (here, "1" or "0") specified by the write instruction. With this, the specified data is written into the storage element 3 which has an address specified by the write instruction. It is to be noted that an application operation of the write voltage Vw will be described later in detail On the other hand, when a read instruction is provided to the storage device 21 from the above-described controller, the bit line decoder 4 selects one of the bit lines BL0 to BL3, which has an address specified by the read instruction. On the other hand, the word line decoders 6 and 7 select one of the word lines WL0 to WL3, which has an address specified by the read instruction. With this, the storage element 3 from which data is to be read is selected. Then, the bit line decoder 4 and the word line decoders 6 and 7 cooperates with each other to apply, between the selected one of the bit lines BL0 to BL3 and the selected one of the word lines WL0 to WL3, electric pulses having a predetermined read voltage Vr. Then, the read circuit 5 detects current flowing through the selected one of the bit lines BL0 to BL3 to detect, based on the detected current, whether the value of data stored in the selected storage element 3 is "1" or "0". Then, the read circuit 5 outputs, to the controller, the detected value of "1" or "0" as read data. It is to be noted that an application operation of the read voltage Vr will be described later in detail The following describes the application operation of the write voltage Vw and the application operation of the read voltage Vr in detail, with reference to the drawings.

Figure 24:
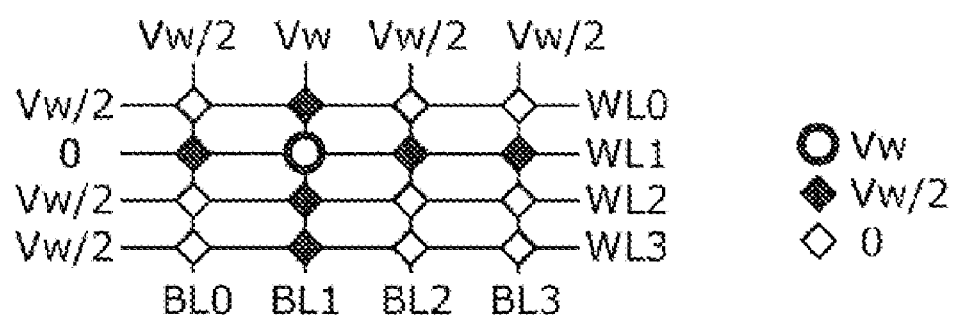
FIG. 24 is a schematic diagram which shows an operation of applying a write voltage according to an embodiment of the present invention.

FIG. 24 is a schematic diagram which shows a specific application operation of the write voltage according to an embodiment of the present invention. It is to be noted that, in the following description, an operation in the case where the storage element 3 at the three-dimensional crosspoint of the bit line BL1 and the word line WL1 is selected and data is written into the selected storage element 3 (hereinafter referred to as "selected element"), is taken as an example. The selected element corresponds to one of the storage elements 3 shown in FIG. 22A.

In FIG. 24, the vertical lines represent, starting from the left, the bit line BL0, BL1, BL2, and BL3. A voltage value applied to each of the bit lines is described at an upper end of each of the bit lines. On the other hand, the horizontal line lines represent, starting from the top, the word line WL0, WL1, WL2, and WL3. A voltage value applied to each of the word lines is described at a left end of each of the word lines.

In FIG. 24, a symbol at each of the crosspoints of the vertical lines and the horizontal lines shows an absolute value of a voltage difference between the both ends of each of the storage elements 3 at each of the three-dimensional crosspoints of the bit lines BL0 to BL3 and the word lines WL0 to WL3 included in the storage element array of four lines and four columns. Accordingly, this shows that the absolute value of the potential difference between the both ends of each of the storage elements 3 other than the selected element (the storage element 3 at the three-dimensional crosspoint 11 of the bit line BL1 and the word line WL1) is either Vw/2 or 0, and thus data is not written into the storage elements 3 other than the selected element at the time of writing data into the selected element.

More specifically, the bit line decoder 4 applies the write voltage Vw to the bit line BL1 connected to the selected element, according to the present embodiment. Furthermore, the word line decoder 7 applies the voltage 0 to the word line WL1 connected to the selected element. With this, the current steering element 2 of the storage element 3 that is the selected element becomes conductive. Then, current sufficient for changing the resistance state flows thorough the variable resistance element 1, and as a result, the resistance value of the variable resistance element 1 changes to the high resistance state or the low resistance state.

On the other hand, other storage elements 3 in the column direction, which shares the bit line BL 1 but does not share the word line WL1 (more specifically, the storage elements 3 at each of the three-dimensional crosspoints 11 of the bit line BL1 and the word line WL0, WL2, and WL3) are called semi-selected elements (BL selection) because only the bit line among the bit line and the word line is selected. Then, the write voltage Vw is applied by the bit line decoder 4 to the bit line BL1 connected to these semi-selected elements (BL selection) in the same manner as in the selected element, and the voltage of Vw/2 is applied by the word line decoders 6 and 7 to the word line group (the word lines WL0, WL2, and WL3). With this, the potential difference between the both ends of each of the semi-selected elements (BL selection) is set at Vw/2.

Furthermore, other storage elements 3 in the row direction, which share the word line WL1 but does not share the bit line BL1 (more specifically, the storage element 3 at each of the three-dimensional crosspoints 11 of the word line WL1 and the bit lines BL0, BL2, and BL3) are called semi-selected elements (WL selected) because only the word line among the bit line and the word line is selected. Then, the voltage 0 is applied by the word line decoder 7 to the word line WL1 connected to these semi-selected elements (WL selection) in the same manner as in the selected element, and the voltage of Vw/2 is applied by the bit line decoder 4 to the bit line group (the bit lines BL0, BL2, and BL3). With this, the potential difference between the both ends of each of the semi-selected elements (WL selection) is set at Vw/2.

According to the present embodiment, the current steering element 2 is designed to become a shut off state (the state in which current flowing through the current steering element 2 is significantly small) at the potential difference of Vw/2 applied to the both ends of the semi-selected element. Accordingly, current hardly flows through the variable resistance element 1 of the semi-selected element. Therefore, data is not written into the variable resistance element 1 of the semi-selected element. Conversely, according to the present embodiment, the write voltage Vw is set such that only significantly small current flows through the variable resistance element 1 at the potential difference of Vw/2 applied to the both ends of the semi-selected element, thereby preventing writing data into the semi-selected elements.

In addition, since the voltage of Vw/2 is applied to the both ends of each of the unselected elements (more specifically, the storage elements 3 at the three-dimensional crosspoints 11 of the bit lines BL0, BL2, and BL3 and the word lines WL0, WL2, and WL3), there is no potential difference between the both ends of the storage element 3. Therefore, data is not written into the variable resistance elements 1 of these unselected elements. With this it is possible to write data into only the selected element without writing data into semi-selected elements and unselected elements. Thus, it is possible to prevent write disturb.

It is to be noted that, at the time of the operation of reading data, the read voltage Vr and the voltage 0 are applied to the bit line BL1 of the selected element and the word line WL1, respectively. Further at this time, the voltage of Vr/2 is applied to the unselected elements in the same manner as in the data writing operation. Thus, the write voltage Vw in FIG. 23 is replaced with the read voltage Vr. With this, data is read from the selected storage element 3.

As described above, according to the present invention, when the voltage of electric pulses is set such that a voltage with a large absolute value is applied to the variable resistance element into which data is to be written at the time of writing data into the storage element and a voltage with a small absolute value is applied to other variable resistance elements, large current flows through the variable resistance element into which data is to be written and current doest not flow through the other variable resistance elements. Thus, even when the variable resistance element is composed of a metal oxide material, data is reliably written into the selected storage element and data is not written into the other storage elements.

In addition, the current steering element according to the present invention shows electric resistance characteristics similar to the electric resistance characteristics of the MIM diode, the varistor, and the like, for the applied voltage whose polarity is either positive or negative, and thus bypass current is reliably suppressed even when write electric pulses of different polarities are applied. With this, it is possible to reliably prevent the occurrence of write disturb in the storage device.

In addition, according to the present invention, since a current steering element can be manufactured using a manufacturing process and manufacturing facilities for semiconductors, it is possible to easily miniaturize a current steering element and manufacture a high quality current steering element. This realizes miniaturization and improvement of quality of the storage element to which data is written by applying electric pulses having different polarities and the storage device in which the storage elements are provided in a matrix.

The current steering element, the storage element, and the storage device according to the present invention are described above, however, the present invention is not limited to the embodiments above. For example, other forms in which various modifications of the embodiments apparent to those skilled in the art are included within the scope of the present invention.

In addition, the present invention can be implemented not only as the current steering element 2, the storage element 3, and the storage device 21 but also a method of manufacturing the current steering element 2, the storage element 3, and the storage device 21.

Figure 26:
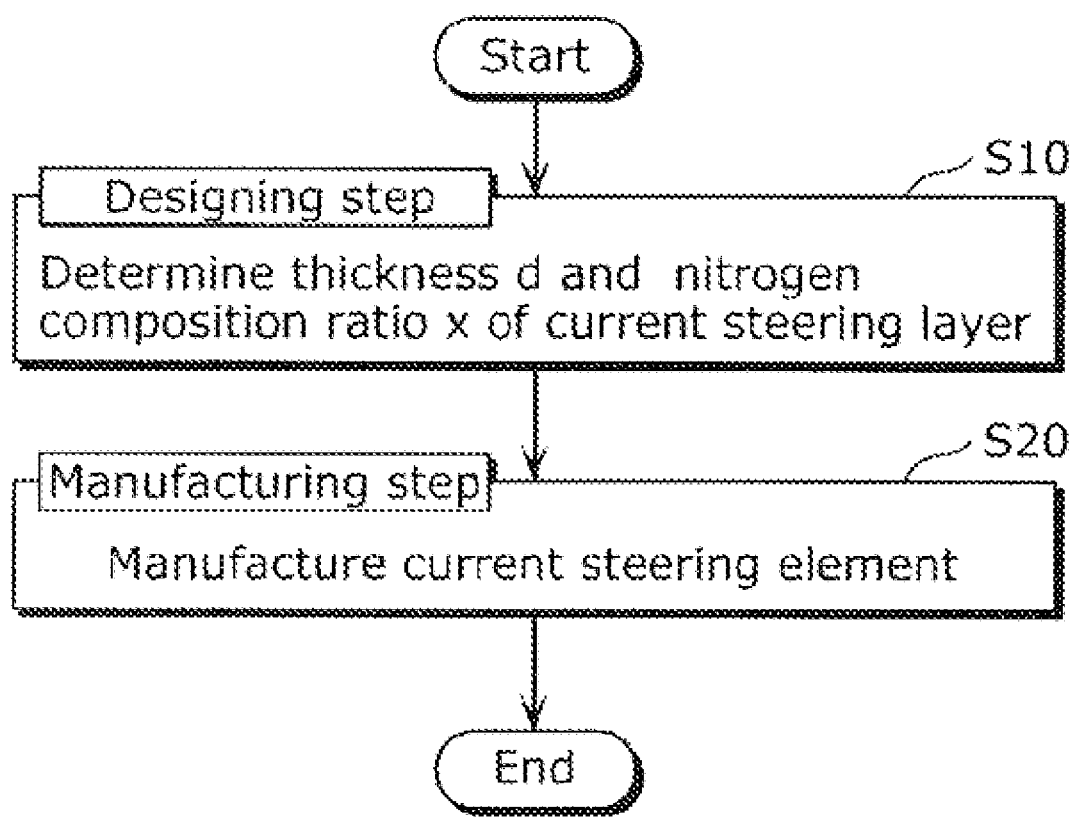
FIG. 26 is a flow chart which shows the entire process of a method of manufacturing a current steering element according to an aspect of the present invention.
Figure 27:
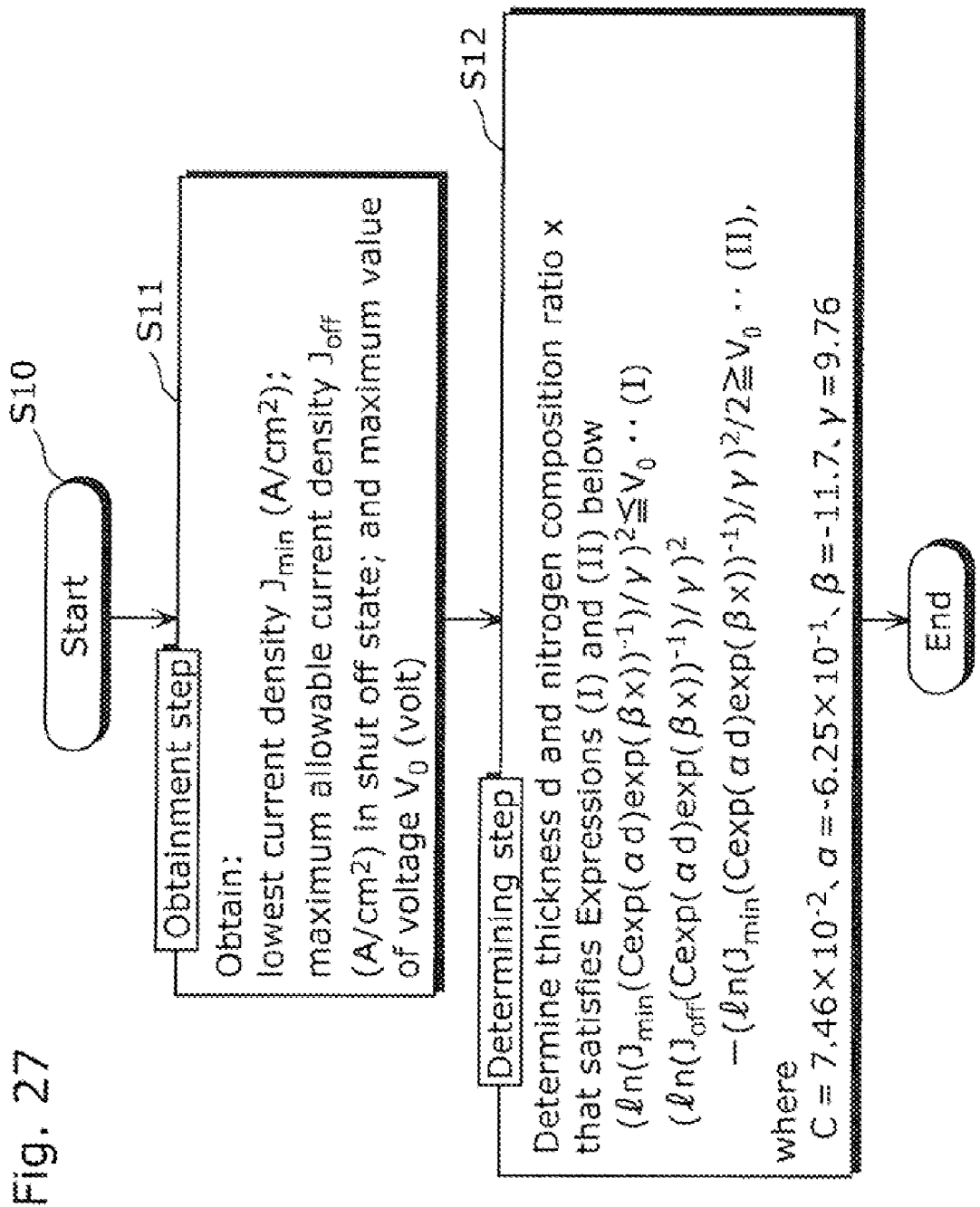
FIG. 27 is a flow chart which shows a detailed process of a designing step S10 of FIG. 26.

The following describes the method of manufacturing the current steering element 2 according to the present invention with reference to FIG. 26 to FIG. 28.

FIG. 26 is a flow chart which shows the entire process of the method of manufacturing the current steering element 2 according to the present invention. This is a method of manufacturing the current steering element 2 which includes: a first electrode 32; a second electrode 31; and a current steering layer 33 including $SiN_x$ interposed between the first electrode 32 and the second electrode 31 (see FIG. 2) and which steers passing current that flows at the time of applying electric pulses having a positive and a negative polarities. The method of manufacturing the current steering element 2 includes: a designing step S10 in which a thickness d and a nitrogen composition ratio x of the current steering layer 33 are determined; and a manufacturing step S20 in which the current steering element 2 is manufactured according to the thickness d and the nitrogen composition ratio x which are determined in the designing step S10.

FIG. 27 is a flow chart which shows a detailed process of the designing step S10 of FIG. 26. In the designing step S10, first, the following are obtained or determined (an obtainment step S11) as requested specifications: the lowest current density $J_{min}$ (A/cm$^2$) of current to be caused to flow through the current steering element 2; the maximum allowable current density $J_{off}$ (A/cm$^2$) of current that flow through the current steering element 2 when the current steering element 2 is in the shut off state; and the maximum value of a voltage $V_0$ (volt) that can be applied between both ends of the current steering element 2. Next, the thickness d and the nitrogen composition ratio x in a range that satisfies Expression (14) and Expression (15) below are determined (a determining step S11) using the obtained or determined current density $J_{min}$, the current density $J_{off}$, and $V_0$.

$$(\ln(J_{min}(C \exp(\alpha d)\exp(\beta x))^{-1})/\gamma)^2 \leq V_0 \quad (14)$$

$$(\ln(J_{off}(C \exp(\alpha d)\exp(\beta x))^{-1})/\gamma)^2 - (\ln(J_{min}(C \exp(\alpha d)\exp(\beta x))^{-1})/\gamma)^2/2 \geq 0 \quad (15)$$

where $C=7.46\times 10^{-2}$, $\alpha=-6.25\times 10^{-1}$, $\beta=-11.7$, $\gamma=9.76$ It is to be noted that, in the determining step S12, the thickness d is determined to be equal to or larger than 5 nm, and the nitrogen composition ratio x is determined to satisfy $0<x\leq 0.85$, for example.

FIG. 28 is a flow chart which shows a detailed process of the manufacturing step S20 of FIG. 26. In the manufacturing step S20, first, the first electrode 32 that includes tantalum nitride or α-tungsten is formed on a substrate 30 (S21), next, a SiN$_x$ film (current steering layer 33) having the thickness d and the nitrogen composition ratio x determined in the designing step S10 is formed on the formed first electrode 32 (S22), and the second electrode 31 that includes tantalum nitride or a-tungsten is formed on the formed SiN$_x$ film (current steering layer 33) (S23). It is to be noted that details of each of the steps S21 to S23 (the manufacturing conditions such as the temperature, the pressure, and so on) have already been described as "the method of manufacturing the current steering element".

As described above, with the manufacturing method of the current steering element according to the present invention, the thickness d and the nitrogen composition ratio x of the current steering layer 33 are determined for ensuring the lowest current density of current to be caused to flow through the current steering element in the designing step (see Expression 12) and for ensuring that the current density in the shut off state is lower than the allowable value (see Expression 13), and then the current steering element is manufactured according to the determined thickness d and the nitrogen composition ratio x. Thus, with a memory cell in which the current steering element manufactured as described above is connected to the variable resistance element, it is possible to implement a memory device which is capable of: ensuring that data is reliably written into when selected as a target for writing and that data is not written into when not selected; preventing occurrence of write disturb even when electric pulses having different polarities are applied; and causing large current to flow through the variable resistance element, and into which data can be written without problem.

INDUSTRIAL APPLICABILITY

The current steering element according to the present invention and the storage element using the current steering element and the variable resistance element according to the present invention has sufficient industrial applicability as the storage element and the current steering element used for the storage element which are capable of: preventing occurrence of write disturb even when electric pulses having different polarities are applied; and causing large current to flow through the variable resistance element, and into which data can be written without problem.

REFERENCE SIGNS LIST

1 variable resistance element
2 current steering element
3 storage element
4 bit line decoder
5 read circuit
6, 7 word line decoders
11 three-dimensional crosspoint
20 storage element array
21 storage element
30 substrate
31 second electrode
32 first electrode
33 current steering layer
WL0 to WL3 word lines
BL0 to BL3 bit lines

The invention claimed is:

1. A current steering element which steers passing current that flows when electric pulses having a positive polarity and a negative polarity are applied, said current steering element comprising:
    a first electrode;
    a second electrode; and
    a current steering layer interposed between said first electrode and said second electrode,
    wherein, when said current steering layer includes SiN$_x$ in which x denotes a nitrogen composition ratio and is within a range of $0<x\leq 0.85$ and has a thickness of d nanometer, and a maximum value of a voltage that can be applied between both ends of said current steering element is $V_o$ volt, a relationship between the nitrogen composition ratio x and the thickness d is in a range that satisfies Expression (1) and Expression (2), the Expression (1) being $(\ln(10000(C \exp(\alpha d)\exp((\beta x))^{-1})/\gamma)^2 \leq V_0$, and the Expression (2) being $(\ln(1000(C \exp(\alpha d)\exp((\beta x))^{-1})/\gamma)^2 - (\ln(10000(C \exp(\alpha d)\exp((\beta x))^{-1})/\gamma)^2/2 \geq 0$, where $C=7.46\times 10^{-2}$, $\alpha=-6.25\times 10^{-1}$, $\beta=-11.7$, $\gamma=9.76$.

2. The current steering element according to claim 1, wherein the thickness d of said current steering layer is equal to or larger than 5 nm.

3. The current steering element according to claim 1, wherein said first electrode and said second electrode include tantalum nitride or alpha-tungsten.

4. A storage element comprising:
    a variable resistance element which is non-volatile and has an electric resistance value reversibly changes in response to application of electric pulses having a positive polarity and a negative polarity; and
    said current steering element according to claim 1, said current steering element being connected in series to said variable resistance element and steering passing current that flows when the electric pulses are applied to said variable resistance element.

5. A storage device comprising:
    a plurality of bit lines;
    a plurality of word lines each of which three-dimensionally crosses a corresponding one of said plurality of bit lines; and
    a plurality of storage elements including said storage element according to claim 4,
    wherein each of said plurality of storage elements is provided at a corresponding one of crosspoints at which said plurality of bit lines and said plurality of word lines three-dimensionally cross each other, and has one end connected to a corresponding one of said plurality of bit lines and an other end connected to a corresponding one of said plurality of word lines.

6. A method of manufacturing a current steering element which includes: a first electrode; a second electrode; and a current steering layer including $SiN_x$ interposed between the first electrode and the second electrode, and which steers current that flows when electric pulses having a positive polarity and a negative polarity are applied, said method comprising:

designing the current steering element by determining a thickness d and a nitrogen composition ratio x of the current steering layer; and manufacturing the current steering element according to the thickness d and the nitrogen composition ratio x determined in said designing, wherein said designing includes:

obtaining: a lowest current density $J_{min}$ (A/cm$^2$) of current necessary to flow through the current steering element; a maximum allowable current density $J_{off}$ (A/cm$^2$) of current that flows through the current steering element when the current steering element is in a shut off state; and a maximum value $V_0$ (volt) of a voltage that can be applied between both ends of the current steering element; and determining the thickness d and the nitrogen composition ratio x which are in a range that satisfies Expression (3) and Expression (4), using the current density $J_{min}$, the current density $J_{off}$, and the $V_0$ which have been obtained in said obtaining, the Expression (3) being $(\ln(J_{min}(C \exp(\alpha d)\exp(\beta x))^{-1})/\gamma)^2 \leq V_0$, and the Expression (4) being $(\ln J_{off}(C \exp(\alpha d)\exp(\beta x))^{-1})/\gamma)^2 - (\ln(J_{min}(C \exp(\alpha d)\exp(\beta)x)^{-1})/\gamma)^2/2 \geq 0$, where $C=7.46\times10^{-2}$, $\alpha=-6.25\times10^{-1}$, $\beta=-11.7$, $\gamma=9.76$.

7. The method of manufacturing a current steering element according to claim 6, wherein, in said determining, the thickness d and the nitrogen composition ratio x are determined such that the thickness d is equal to or larger than 5 nm and the nitrogen composition ratio x satisfies $0<x\leq0.85$.

8. The method of manufacturing a current steering element according to claim 6, wherein said manufacturing includes:

forming the first electrode on a substrate, the first electrode including tantalum nitride or α-tungsten;

forming a $SiN_x$ film on the first electrode, the $SiN_x$ film having the thickness d and the nitrogen composition ratio x which have been determined in said designing; and forming the second electrode on the $SiN_x$ film, the second electrode including tantalum nitride or alpha-tungsten.

9. The current steering element according to claim 1, wherein the SiNx forms an amorphous semiconductor.

* * * * *